United States Patent
Sakurai et al.

(12)

(10) Patent No.: US 10,674,106 B2
(45) Date of Patent: Jun. 2, 2020

(54) SEMICONDUCTOR APPARATUS AND EQUIPMENT

(71) Applicant: CANON KABUSHIKI KAISHA, Tokyo (JP)

(72) Inventors: Katsuhito Sakurai, Machida (JP); Yoshiaki Takada, Kawasaki (JP); Takahiro Shirai, Isehara (JP); Hideo Kobayashi, Tokyo (JP); Kohichi Nakamura, Kawasaki (JP); Daisuke Yoshida, Ebina (JP); Fumihiro Inui, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 49 days.

(21) Appl. No.: 16/142,651

(22) Filed: Sep. 26, 2018

(65) Prior Publication Data

US 2019/0104270 A1 Apr. 4, 2019

(30) Foreign Application Priority Data

Sep. 29, 2017 (JP) .................. 2017-192050

(51) Int. Cl.
| | |
|---|---|
| *H04N 5/369* | (2011.01) |
| *H04N 5/3745* | (2011.01) |
| *H01L 27/146* | (2006.01) |
| *H01L 27/16* | (2006.01) |
| *H04N 5/378* | (2011.01) |

(Continued)

(52) U.S. Cl.
CPC ....... *H04N 5/379* (2018.08); *H01L 27/14634* (2013.01); *H01L 27/14636* (2013.01); *H04N 5/347* (2013.01); *H04N 5/36961* (2018.08); *H04N 5/378* (2013.01); *H04N 5/3741* (2013.01); *H04N 5/37457* (2013.01); *H01L 27/14641* (2013.01)

(58) Field of Classification Search
None
See application file for complete search history.

(56) References Cited

U.S. PATENT DOCUMENTS

| | | |
|---|---|---|
| 2012/0307030 A1 | 12/2012 | Blanquart |
| 2013/0126707 A1 | 5/2013 | Blanquart |
| 2013/0126708 A1 | 5/2013 | Blanquart |

(Continued)

FOREIGN PATENT DOCUMENTS

| | | |
|---|---|---|
| JP | 2006-049361 A | 2/2006 |
| JP | 2012-104684 A | 5/2012 |

(Continued)

*Primary Examiner* — Mark T Monk
(74) *Attorney, Agent, or Firm* — Canon U.S.A., Inc. IP Division

(57) ABSTRACT

A semiconductor apparatus includes a stack of first and second chips each having a plurality of pixel circuits arranged in a matrix form. The pixel circuit of the a-th row and the e1-th column is connected to the electric circuit of the p-th row and the v-th column. The pixel circuit of the a-th row and the f1-th column is connected to the electric circuit of the q-th row and the v-th column. The pixel circuit of the a-th row and the g1-th column is connected to the electric circuit of the r-th row and the v-th column. The pixel circuit of the a-th row and the h1-th column is connected to the electric circuit of the s-th row and the v-th column.

25 Claims, 28 Drawing Sheets

(51) Int. Cl.
*H04N 5/374* (2011.01)
*H04N 5/347* (2011.01)

(56) References Cited

U.S. PATENT DOCUMENTS

2013/0126709 A1    5/2013  Blanquart
2014/0077057 A1*   3/2014  Chao ................. H01L 27/14634
                                              250/208.1

FOREIGN PATENT DOCUMENTS

| JP | 2013-51674  A | 3/2013 |
| JP | 2014-195112 A | 10/2014 |
| JP | 2016-058532 A | 4/2016 |
| JP | 2016-072896 A | 5/2016 |
| JP | 2016-171375 A | 9/2016 |
| JP | 2016-171399 A | 9/2016 |
| JP | 2016-171455 A | 9/2016 |
| JP | 2016-181935 A | 10/2016 |
| JP | 2017-022259 A | 1/2017 |
| JP | 2017-184244 A | 10/2017 |

* cited by examiner

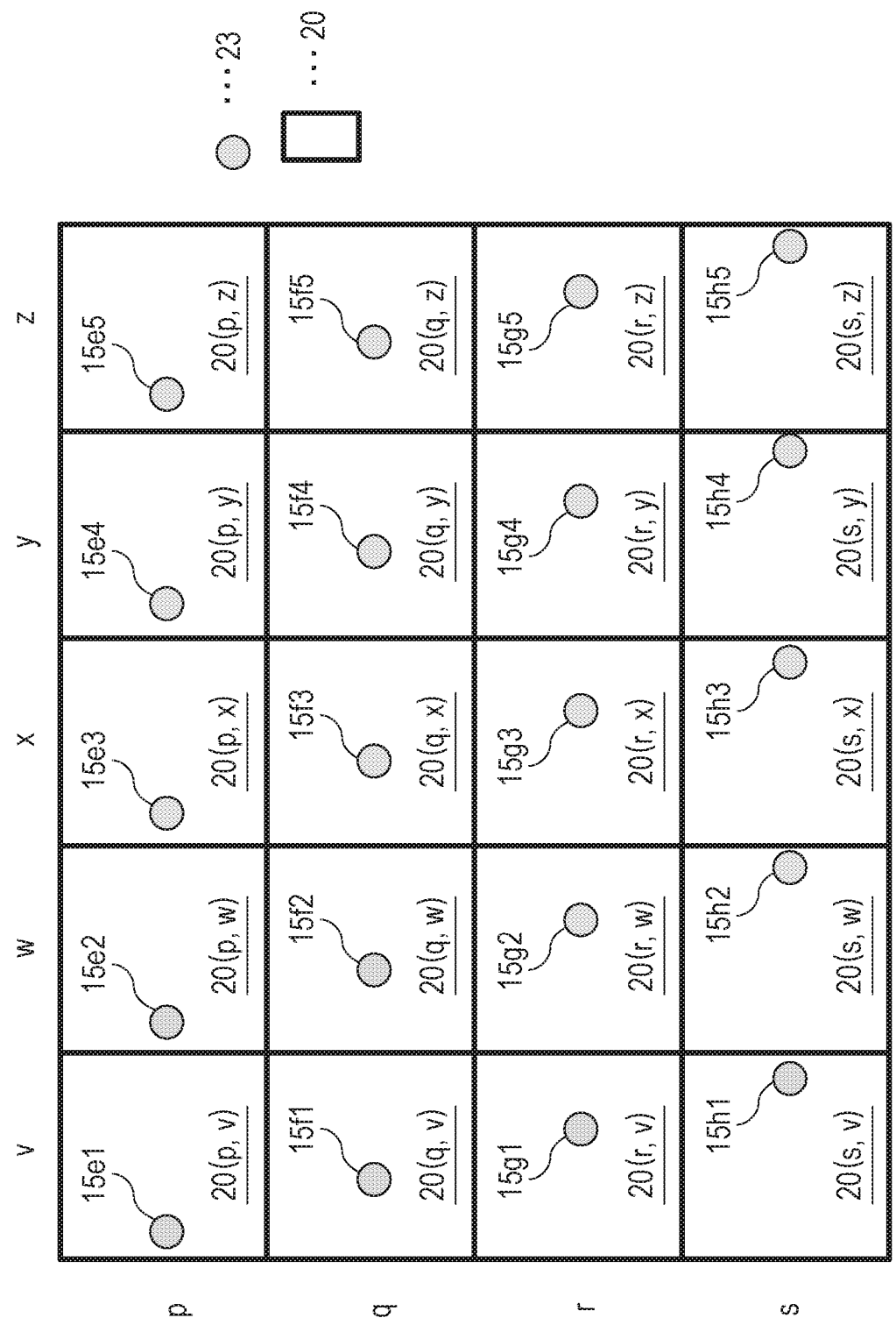

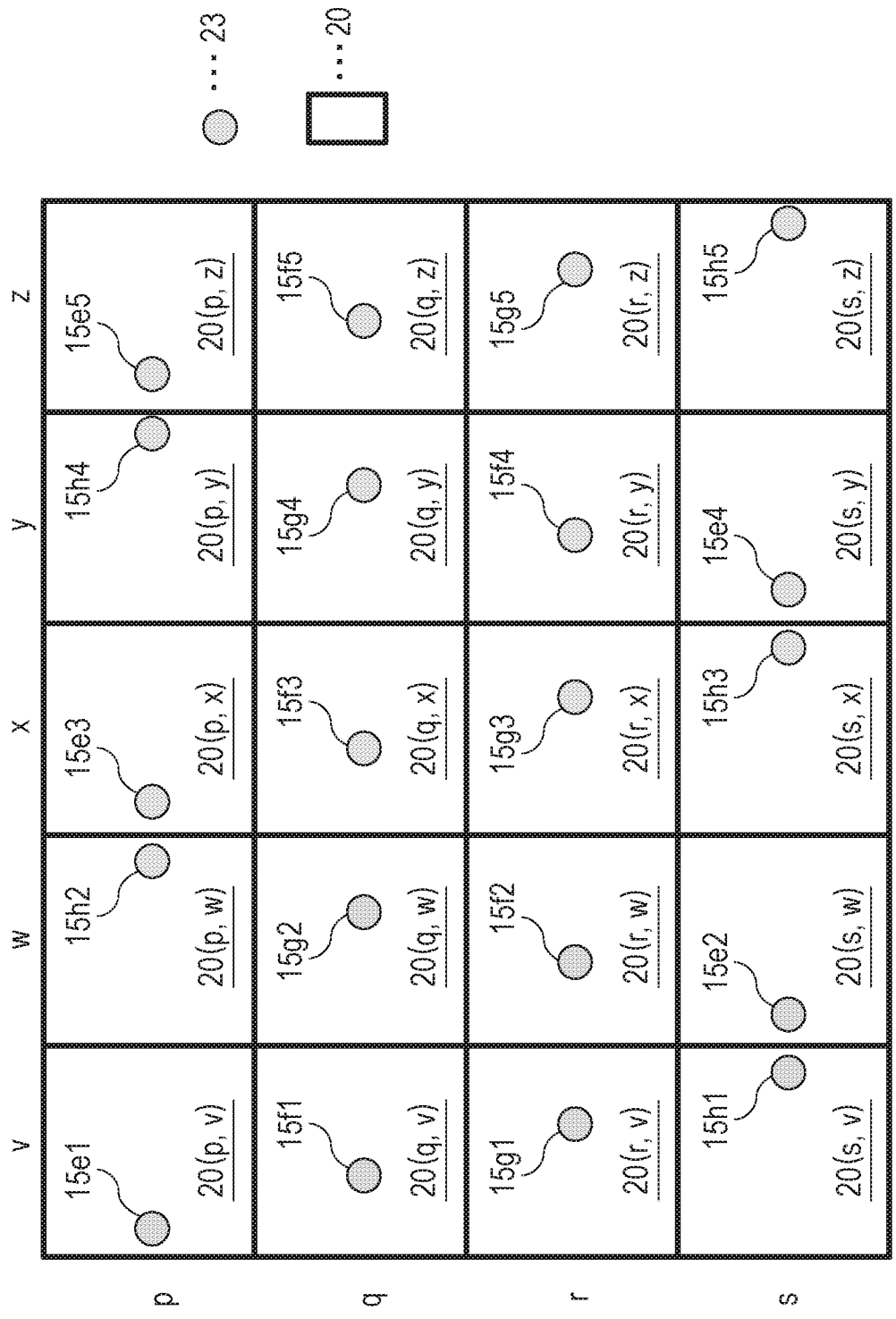

| | v | w | x | y | z |
|---|---|---|---|---|---|
| p1 | 15e11<br>20(p1, v) | 15h21<br>20(p1, w) | 15e31<br>20(p1, x) | 15h41<br>20(p1, y) | 15e51<br>20(p1, z) |
| q1 | 15f11<br>20(q1, v) | 15g21<br>20(q1, w) | 15f31<br>20(q1, x) | 15g41<br>20(q1, y) | 15f51<br>20(q1, z) |
| r1 | 15g11<br>20(r1, v) | 20(r1, w) | 15g31<br>20(r1, x) | 15f41<br>20(r1, y) | 15g51<br>20(r1, z) |
| s1 | 15h11<br>20(s1, v) | 15e21<br>20(s1, w) | 15h31<br>20(s1, x) | 15e41<br>20(s1, y) | 15h51<br>20(s1, z) |
| p2 | 15e12<br>20(p2, v) | 15h22<br>20(p2, w) | 15e32<br>20(p2, x) | 15h42<br>20(p2, y) | 15e52<br>20(p2, z) |
| q2 | 15f12<br>20(q2, v) | 15g22<br>20(q2, w) | 15f32<br>20(q2, x) | 15g42<br>20(q2, y) | 15f52<br>20(q2, z) |
| r2 | 15g12<br>20(r2, v) | 15f22<br>20(r2, w) | 15g32<br>20(r2, x) | 15f42<br>20(r2, y) | 15g52<br>20(r2, z) |
| s2 | 15h12<br>20(s2, v) | 15e22<br>20(s2, w) | 15h32<br>20(s2, x) | 15e42<br>20(s2, y) | 15h52<br>20(s2, z) |

FIG. 6B

| | v | w | x | y | z |
|---|---|---|---|---|---|
| p1 | 15e11<br>20(p1, v) | 15h21<br>20(p1, w) | 15e31<br>20(p1, x) | 15h41<br>20(p1, y) | 15e51<br>20(p1, z) |
| q1 | 15f11<br>20(q1, v) | 15g21<br>20(q1, w) | 15f31<br>20(q1, x) | 15g41<br>20(q1, y) | 15f51<br>20(q1, z) |
| r1 | 15g11<br>20(r1, v) | 15f21<br>20(r1, w) | 15g31<br>20(r1, x) | 15f41<br>20(r1, y) | 15g51<br>20(r1, z) |
| s1 | 15h11<br>20(s1, v) | 15e21<br>20(s1, w) | 15h31<br>20(s1, x) | 15e41<br>20(s1, y) | 15h51<br>20(s1, z) |
| p2 | 15h12<br>20(p2, v) | 15e22<br>20(p2, w) | 15h32<br>20(p2, x) | 15e42<br>20(p2, y) | 15h52<br>20(p2, z) |
| q2 | 15g12<br>20(q2, v) | 15f22<br>20(q2, w) | 15g32<br>20(q2, x) | 15f42<br>20(q2, y) | 15g52<br>20(q2, z) |
| r2 | 15f12<br>20(r2, v) | 15g22<br>20(r2, w) | 15f32<br>20(r2, x) | 15g42<br>20(r2, y) | 15f52<br>20(r2, z) |
| s2 | 15e12<br>20(s2, v) | 15h22<br>20(s2, w) | 15e32<br>20(s2, x) | 15h42<br>20(s2, y) | 15e52<br>20(s2, z) |

◯ ···23
▭ ···20

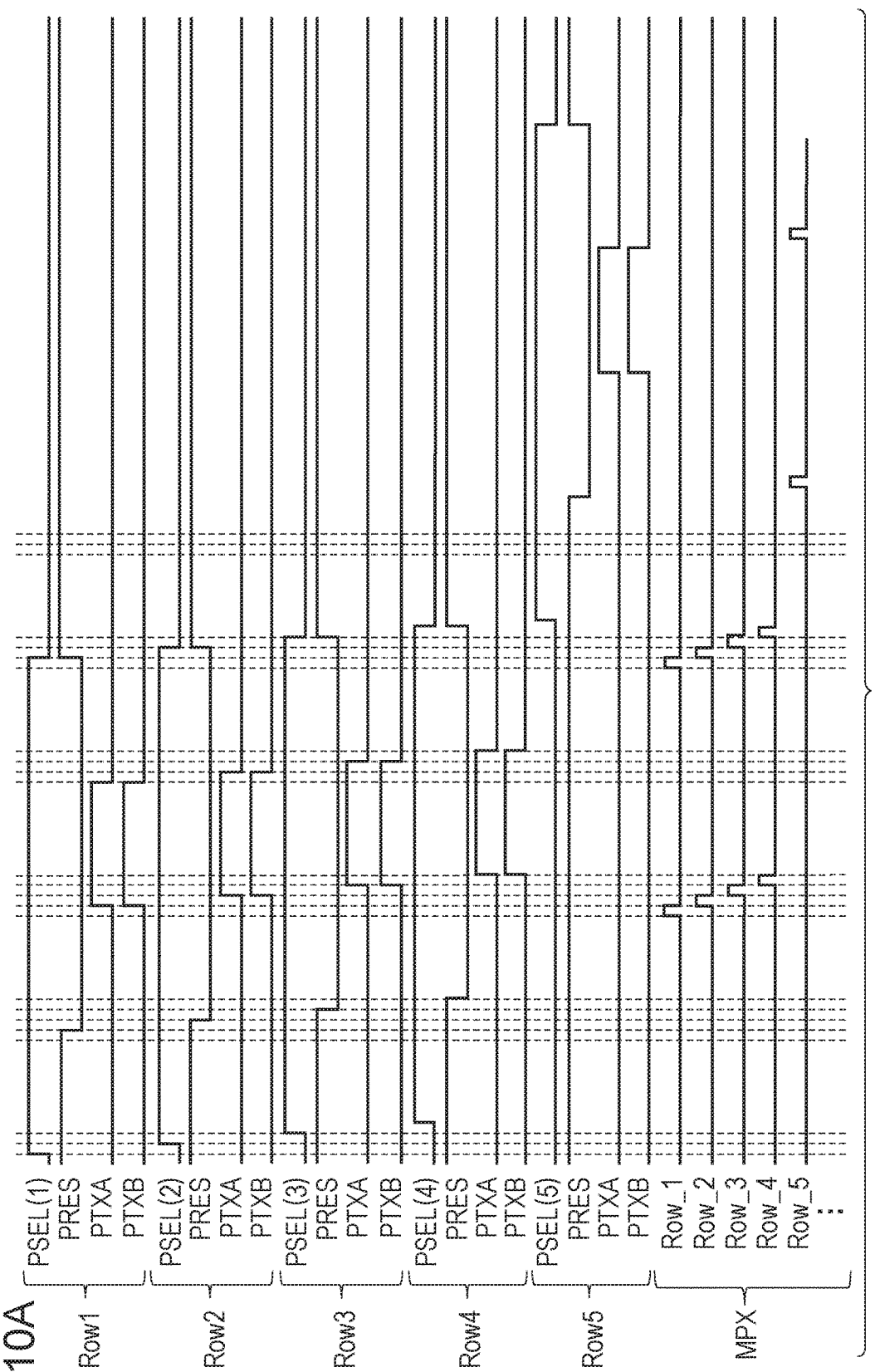

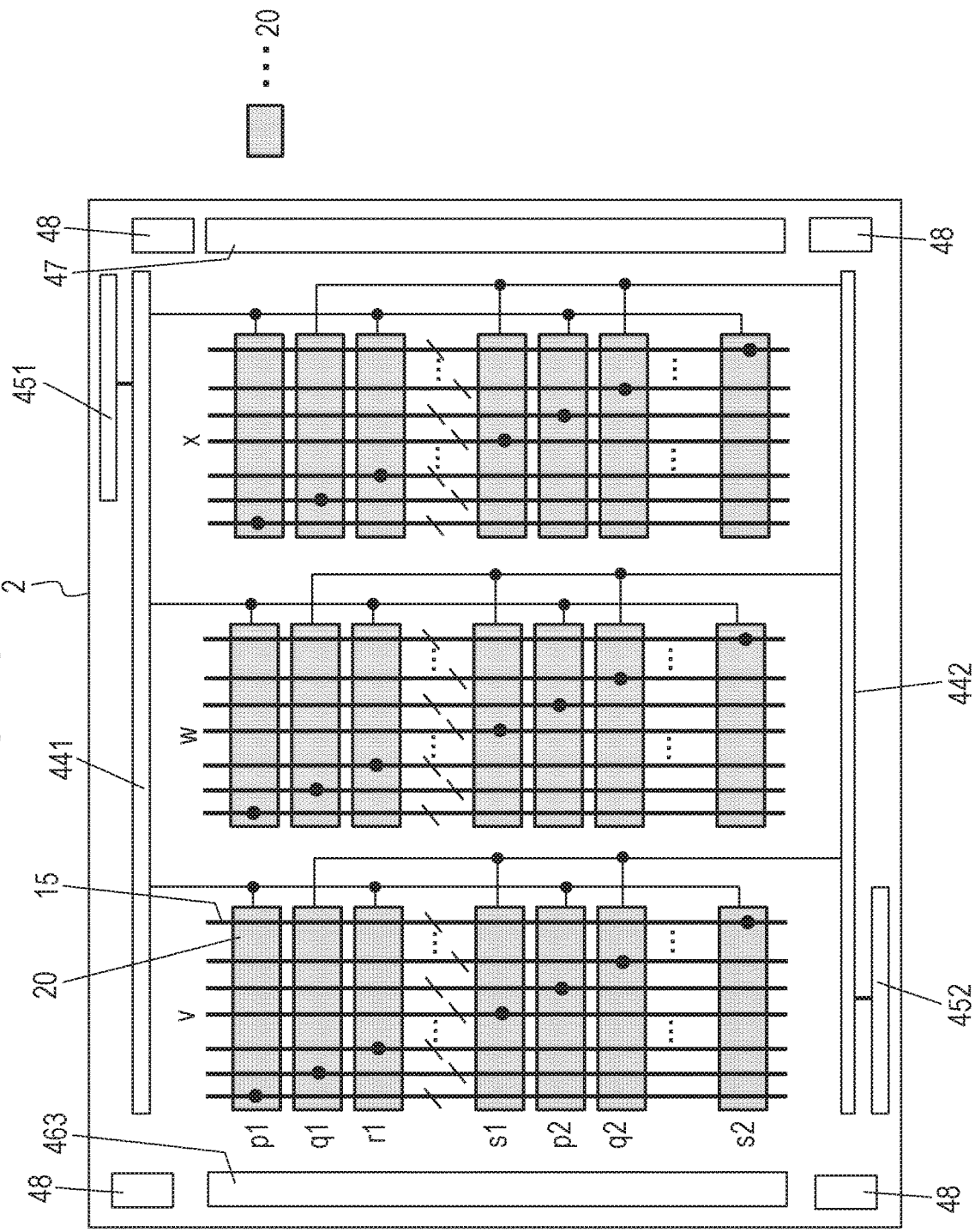

US 10,674,106 B2

SEMICONDUCTOR APPARATUS AND EQUIPMENT

BACKGROUND OF THE INVENTION

Field of the Invention

One disclosed aspect of the embodiments relates to a semiconductor apparatus having a stack of a plurality of chips.

Description of the Related Art

An imaging apparatus having a stack of a chip including a pixel circuit and a chip including an electric circuit configured to process a signal from the pixel circuit may be used for greatly improved values of the imaging apparatus. Japanese Patent Laid-Open No. 2012-104684 and Japanese Patent Laid-Open No. 2013-51674 disclose that a substrate having a plurality of column circuits thereon and a substrate having a pixel unit thereon are stacked.

An electric circuit configured to process a signal may have a varied property depending on the position of the electric circuit. According to a correspondence relationship between an electric circuit and a pixel circuit, a resulting image may have unevenness (shading) due to such varied properties of the electric circuit.

SUMMARY OF THE INVENTION

A semiconductor apparatus includes a stack of a first chip having a plurality of pixel circuits arranged in a matrix form of J rows and K columns and a second chip having a plurality of electric circuits arranged in a matrix form of T rows and U columns. Each of the plurality of electric circuits has a first part and a second part. The first part is connected to at least two pixel circuits of the plurality of pixel circuits and the second part. The first part is configured to sequentially select a pixel circuit from the two pixel circuits to connect to the second part. The a-th row and the e1-th column pixel circuit of the plurality of pixel circuits are connected to the electric circuit of the p-th row and the v-th column of the plurality of electric circuits. The a-th row and the f1-th column pixel circuit of the plurality of pixel circuits is connected to the electric circuit of the q-th row and the v-th column of the plurality of electric circuits. The pixel circuit of the a-th row and the g1-th column of the plurality of pixel circuits is connected to the electric circuit of the r-th row and the v-th column of the plurality of electric circuits. The pixel circuit of the a-th row and the h1-th column of the plurality of pixel circuits is connected to the electric circuit of the s-th row and the v-th column of the plurality of electric circuits. T<J and U<K, f1 and g1 are integers between e1 and h1, and q and r are integers between p and s.

Further features of the disclosure will become apparent from the following description of exemplary embodiments with reference to the attached drawings.

BRIEF DESCRIPTION OF THE DRAWINGS

FIGS. 2A and 2B are schematic diagrams illustrating an embodiment of a semiconductor apparatus.

FIGS. 3A and 3B are schematic diagrams illustrating an embodiment of a semiconductor apparatus.

FIGS. 4A and 4B are schematic diagrams illustrating an embodiment of a semiconductor apparatus.

FIGS. 5A and 5B are schematic diagrams illustrating an embodiment of a semiconductor apparatus.

FIGS. 6A and 6B are schematic diagrams illustrating an embodiment of a semiconductor apparatus.

FIGS. 10A and 10B are a schematic diagram illustrating an embodiment of a semiconductor apparatus.

FIG. 15 is a schematic diagram illustrating an embodiment of a semiconductor apparatus.

DESCRIPTION OF THE EMBODIMENTS

Modes for embodying the present disclosure will be described below with reference to drawings. Like numbers refer to like parts throughout the following descriptions and the plurality of drawings. Common configurations will be described with mutual reference to a plurality of drawing, and any repetitive descriptions on like parts referred by like numbers will be omitted.

Figure 1A:
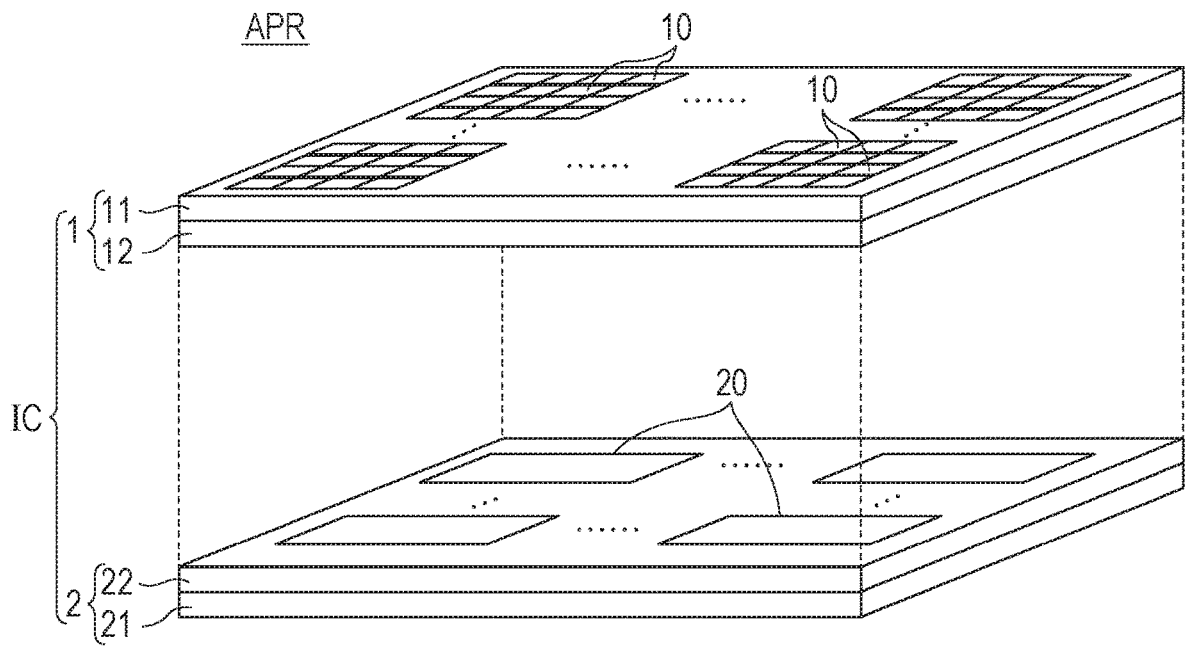
FIGS. 1A and 1B are schematic diagrams illustrating an embodiment of a semiconductor apparatus.

FIG. 1A illustrates a semiconductor apparatus APR. All or a part of the semiconductor apparatus APR are semiconductor apparatus ICs being a laminated member of a chip 1 and a chip 2. The semiconductor apparatus APR according to this embodiment is a photoelectric conversion apparatus which can be used as an image sensor, an AF (Auto Focus) sensor, a light metering sensor, or a ranging sensor, for example. The semiconductor apparatus APR includes a stack of the chip 1 and the chip 2. The chip 1 has a plurality of pixel circuits 10 in a matrix form. The chip 2 has a plurality of electric circuits 20 in a matrix form. Another stack of different chips may be provided on the opposite side of the chip 1 about the chip 2. The other chip can have a DRAM cell array. The DRAM cell array can store a signal processed by a plurality of electric circuits 20.

The chip 1 includes a semiconductor layer 11 and a wiring structure 12. The semiconductor layer 11 has a plurality of semiconductor elements (not illustrated) included in a plurality of pixel circuit 10. The wiring structure 12 includes M wiring layers (not illustrated) included in the plurality of pixel circuit 10. The chip 2 includes a semiconductor layer 21 and a wiring structure 22. The semiconductor layer 21 includes a plurality of semiconductor elements (not illustrated) included in a plurality of electric circuits 20. The wiring structure 22 includes N wiring layers (not illustrated) including a plurality of electric circuits 20.

A wiring structure 12 is disposed between a semiconductor layer 11 and a semiconductor layer 21. A wiring structure 22 is disposed between the wiring structure 12 and the semiconductor layer 21.

The pixel circuit 10 includes a photoelectric conversion element, details of which will be described below, and typically further includes an amplifying element. An electric circuit 20 is an electric circuit having a function for processing a signal from the pixel circuit 10. The electric circuit 20 can further include functions other than a function for signal processing.

Figure 1B:
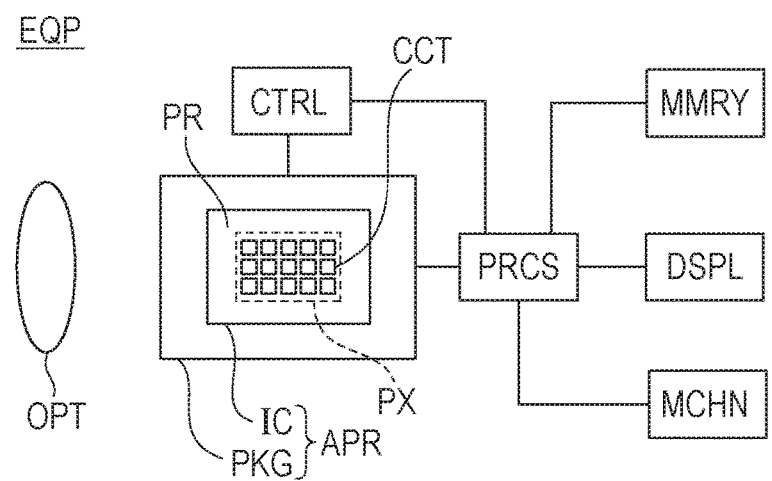

FIG. 1B illustrates an equipment EQP including a semiconductor apparatus APR. A semiconductor apparatus IC has a pixel area PX having pixels CCT including a pixel circuit 10 in a matrix form. The pixel CCT can include a photoelectric conversion element, an amplifying element, a microlens, and a color filter. The semiconductor apparatus IC can have a peripheral area PR surrounding the pixel area PX. The peripheral area PR can have a circuit excluding the pixel circuit 10. The semiconductor apparatus APR can include a package PKG storing the semiconductor apparatus IC, in addition to the semiconductor apparatus IC. The equipment EQP can include at least one of an optical system OPT, a control device CTRL, a processing device PRCS, a display apparatus DSPL, a storage device MMRY and a mechanical apparatus MCHN. The equipment EQP will be described in detail.

First Embodiment

Figure 2A:
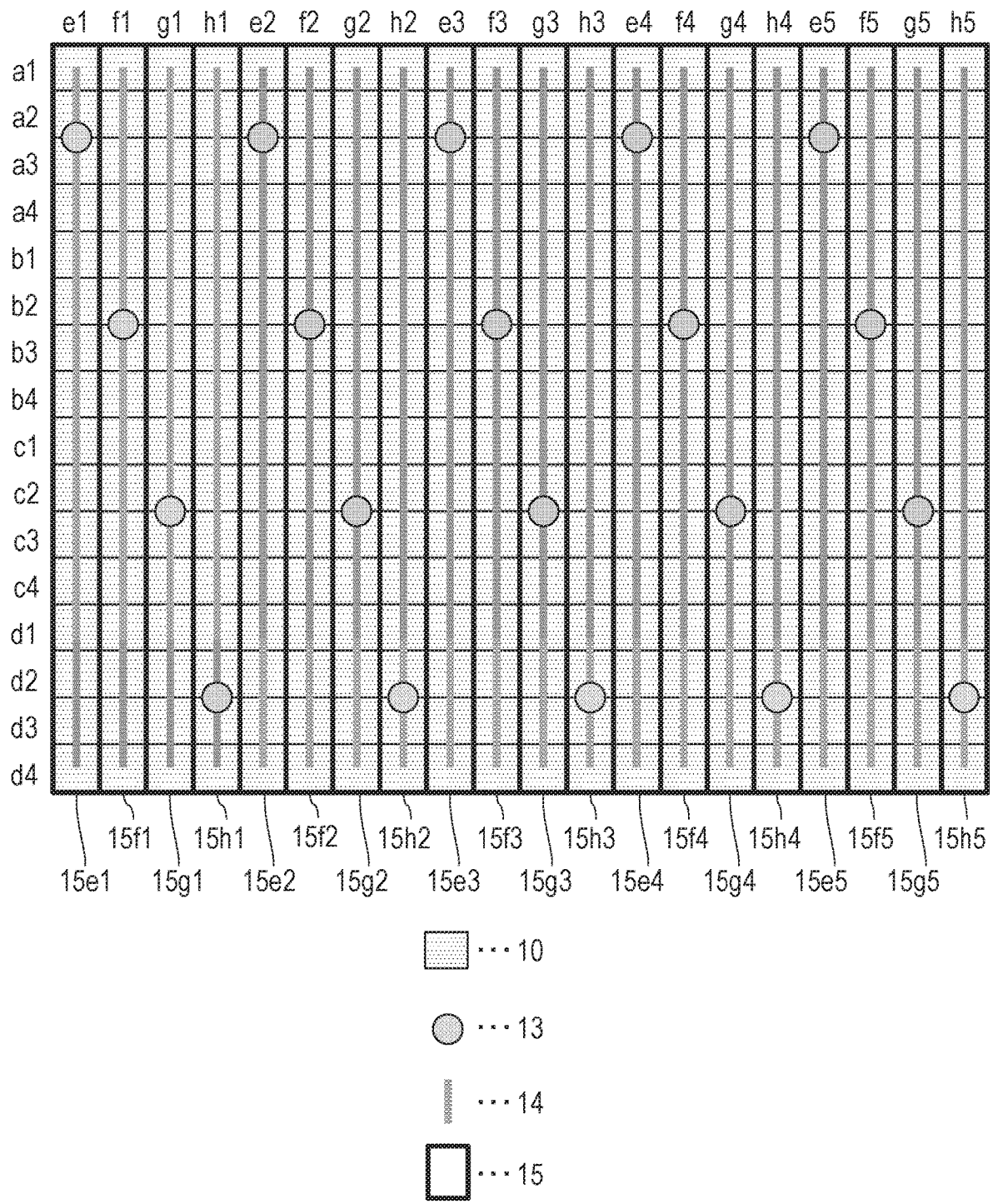

With reference to FIGS. 2A and 2B, a first embodiment will be described. FIG. 2A illustrates an arrangement of a plurality of pixel circuits 10 in a J rows and K columns matrix form in the chip 1. Practically, J≥100, K≥100, and more preferably, J≥1000, K≥1000. The pixel circuit 10 has J rows including the a1-th row to the a4-th row, the b1-th row to the b4-th row, the c1-th row to the c4-th row, the d1-th row to the d4-th row in this order. The a1-th row to the a4-th row includes the a1-th row, the a2-th row, the a3-th row, and the a4-th row in this order, which are collectively called the a-th row. The b1-th row to the b4-th row are collectively called the b-th row, the c1-th row to the c4-th row are collectively called the c-th row, and the d1-th row to the d4-th row are collectively called the d-th row. The a, b, c, d are positive integers where a<b<c<d. The a1, a2, a3, and a4 are positive integers where a1<a2<a3<a4. For example, when a plurality of pixel circuits 10 illustrated in FIG. 2A are all pixel circuits 10, a1=1, a2=2, a3=3, a4=4, b1=5, b4=8, c1=9, c4=12, d1=13, and d4J=16. The following descriptions assume that the a1-th row to the d4-th row are neighboring rows. When the rows are neighboring to each other, a2=1+a1, a3=1+a2, a4=1+a3, and b1=1+a4, c1=1+b4, d1=1+c4. However, this does not deny that there is a row, not illustrated, between two rows.

The pixel circuit 10 has K columns including the e1-th column, the f1-th column, the g1-th column, the h1-th column, the e2-th column, the f2-th column, the g2-th column, and the h2-th column in this order. In other words, e1, f1, g1, h1, e2, f2, g2, and h2 are positive integers where e1<f1<g1<h1<e2<f2<g2<h2. Also h2<e3<f3<g3<h3<e4<f4<g4<h4. For example, in a case where the plurality of pixel circuit 10 illustrated in FIG. 2A are all pixel circuits 10, e1=1, f1=2, g1=3, h1=4, e2=5, f2=6, g2=7, h2=8, h5=K=20. For convenience of description, the e1-th to the h5-th rows are adjacent to each other. In a case where columns are adjacent to each other, f1=1+e1, g1=1+f1, h1=1+g1, e2=1+h4, e3=1+h2, e4=1+h3, e5=1+h4. However, this does not deny that there is a column, not illustrated, between two columns.

In the following descriptions, a pixel circuit 10 of the α-th row and the β-th column is represented by a pixel circuit 10 (α,β). The angle formed by rows and column of the pixel circuit 10 is not limited to 90 degrees but may be in a range of 60 to 120 degrees, and the rows and columns may be arranged in a parallelogram matrix.

Two or more pixel circuits 10 of an identical column are commonly connected to a signal line 14. The signal line 14 extends along a direction in which the pixel circuits 10 of an identical column aligns. For example, pixel circuits 10(a1, e1), 10(b1, e1), 10(c1, e1), and 10(d1, e1) of the e1-th column are connected to a common signal line 14. Although all pixel circuits 10 of an identical column may be commonly connected to one signal line 14, two or more pixel circuits 10 of an pixel circuits 10 of an identical column may be commonly connected to a plurality of signal lines 14. For example, pixel circuits 10(a2, e1), 10(b2, e1), 10(c2, e1), and 10(d2, e1) of the e1-th column may be commonly connected to a signal line 14 different from the signal line 14 to which the pixel circuit 10(a1, e1) is connected. A plurality of pixel circuits 10 connected to a plurality of signal lines 14 are sequentially selected from a pixel circuit 10 to be read to the signal line 14 and are read out. Signals from the pixel circuits 10 of an identical column are read out in parallel to a plurality of signal lines 14 for increased speed of signal reading.

FIG. 2B illustrates a plurality of electric circuits 20 arranged in a T rows and U columns matrix form in the chip 2. Here, T<J, and U<K. T≥10 and U≥10 more practically, and T≤1000 and U≤1000 more preferably. A T-th row of the electric circuit 20 includes the p-th, the q-th, the r-th, and the s-th rows in this order. In other words, p, q, r, s are positive integers where p<q<r<s. For example, a plurality of electric circuits 20 illustrated in FIG. 2B are all electric circuits 20, p=1, q=2, r=3, s=T=4. The following description assumes that the p-th to the s-th rows are neighboring to each other. When rows are neighboring, q=1+p, r=1+q, s=1+r. However, this does not deny that there is a row, not illustrated, between two rows.

A U column of the electric circuit 20 includes the v-th column, the w-th column, the x-th column, the y-th column, and the z-th column in this order. In other words, v, w, x, y, and z are positive integers where v<w<x<y<z. For example, when a plurality of electric circuits 20 illustrated in FIG. 2B are all electric circuits 20, v=1, w=2, x=3, y=4, z=U=5. The following descriptions assume that the v-th to z-th columns are neighboring to each other. When columns are neighboring to each other, w=1+v, x=1+w, y=1+x, z=1+y. However, this does not deny that there is a column, not illustrated, between two columns.

In the following descriptions, the electric circuits 20 of the γ-th row and the δ-th column are represented by an electric circuit 20(γ,δ). The angle formed by rows and column of the electric circuit 20 is not limited to 90 degrees but may be in a range of 60 to 120 degrees, and the rows and columns may be arranged in a parallelogram matrix.

The electric circuits 20 of the v-th column include the p-th row electric circuit 20(p, v), the q-th row electric circuit 20(q, v), the r-th row electric circuit 20(r, v), and the s-th row electric circuit 20(s, v). The electric circuits 20 of the w-th column include the p-th row electric circuit 20(*p, w*), the q-th row electric circuit 20(*q, w*), the r-th row electric circuit 20(*r, w*), and the s-th row electric circuit 20(*s, v*).

Each of a plurality of pixel circuits 10 is connected to one of a plurality of electric circuits 20. The wiring structure 12 has a plurality of conductors 13 as illustrated in FIG. 2A, the wiring structure 22 has a plurality of conductors 23 as illustrated in FIG. 2B. The conductor 13 and the conductor 23 are bonded so that each of a plurality of pixel circuits 10 can be electrically connected to a plurality of electric circuits 20 through the conductor 13 and the conductor 23.

A set of the pixel circuits 10 connected to an identical electric circuit 20 is called a pixel group 15. According to this example, the pixel group 15 includes J pixel circuit 10. In one pixel group 15, all pixel circuits 10 belonging to the one pixel group 15 are connected to an identical electric circuit 20. Pixel circuits 10 not included in the pixel groups 15 other than the pixel group 15 are not connected to the identical electric circuit 20. According to this embodiment, a plurality of pixel circuits 10 of pixel circuits 10 of an identical column is included in a pixel group 15. According to this embodiment, all pixel circuits 10 of an identical column belong to one pixel group 15. For example, all pixel circuits 10 of the e1-th column belong to the pixel group 15e1. Referring to FIG. 2A, the pixel group 15 included in the pixel circuit 10 of the β-th column is represented by a pixel group 15β (where β is e1, f1, e2 or the like).

FIG. 2B illustrates each of the electric circuits 20 is connected to which pixel group 15 of a plurality of pixel groups 15 through the conductors 23 corresponding to the electric circuits 20. For example, the electric circuit 20(*p, v*) is connected to the pixel group 15e1, and the electric circuit 20(*q, v*) is connected to the pixel group 15f1. The electric circuit 20(*r, v*) is connected to the pixel group 15f1, and the electric circuit 20(*s, v*) is connected to the pixel group 15g1. For example, the electric circuit 20(*p, w*) is connected to the pixel group 15e2, electric circuit 20(*q, w*) is connected to the pixel group 15f2. The electric circuit 20(*r, w*) is connected to the pixel group 15g2, and the electric circuit 20(*s, w*) is connected to the pixel group 15h2. For example, the electric circuit 20(*p, x*) is connected to the pixel group 15e3, and the electric circuit 20(*q, x*) is connected to the pixel group 15f3. The electric circuit 20(*r, x*) is connected to the pixel group 15g3, and the electric circuit 20(*s, x*) is connected to the pixel group 15h3.

In the examples illustrated in FIGS. 2A and 2B, all pixel circuits 10 of an identical column belong to an identical pixel group 15. Thus, the all pixel circuits 10 of the e1-th column are connected to the electric circuit 20(*p, v*), and all pixel circuits 10 of the f1-th column are connected to the electric circuit 20(*q, v*). All pixel circuits 10 of the g1-th column are connected to the electric circuit 20(*r,v*), and all pixel circuits 10 of the h1-th column are connected to the electric circuit 20(*s,v*). All pixel circuits 10 of the e2-th column are connected to the electric circuit 20(*p,w*), and all pixel circuits 10 of the f2-th column are connected to the electric circuit 20(*q,w*). All pixel circuits 10 of the g2-th column are connected to the electric circuit 20(*r,w*), and all pixel circuits 10 of the h2-th column are connected to the electric circuit 20(*s,w*). All pixel circuits 10 of the e3-th column are connected to the electric circuit 20(*p,x*), all pixel circuits 10 of the f3-th column are connected to the electric circuit 20(*q,x*). All pixel circuits 10 of the g3-th column are connected to the electric circuit 20(*r,x*), and all pixel circuits 10 of the h3-th column are connected to the electric circuit 20(*s,x*).

In this embodiment, because e1<f1<g1<h1, p<q<r<s, for the electric circuit 20 with an identical column number, as the column number of the pixel circuit 10 increases, the row number of the electric circuit 20 to be connected increases.

A connection relationship between a plurality of pixel circuits 10 and a plurality of electric circuits 20 will be described. In the examples illustrated in FIG. 2A and FIG. 2B, all pixel circuits 10 of the a-th column are connected to the electric circuit 20(*i,j*), all pixel circuits 10 of the b-th column are connected to the electric circuit 20(*k,j*), and all pixel circuits 10 of the c-th column are connected to the electric circuit 20(*s,j*). All pixel circuits 10 of the d-th column are connected to the electric circuit 20(*i,r*), all pixel circuits 10 of the e-th column are connected to the electric circuit 20(*k,r*), and all pixel circuits 10 of the f-th column are connected to the electric circuit 20(*s,r*). All pixel circuits 10 of the g-th column are connected to the electric circuit 20(*i,t*), all pixel circuits 10 of the h-th column are connected to the electric circuit 20(*k,t*), all pixel circuits 10 of the q-th column are connected to the electric circuit 20(*s,t*).

According to this embodiment, because e1<f1<g1<h1, for electric circuits 20 with an identical column number, as the column number of the pixel circuits 10 increases, the row number of the electric circuits 20 to be connected increases.

Because h1<e2, as the column number of the pixel circuits 10 increases (from the h1-th column to the e2-th column), the column number of the electric circuits 20 to be connected changes (from the v-th column to the w-th column). The column number of the pixel circuits 10 allocated to an identical column electric circuits 20 is e2−e1, which is equal to the row number T (T=e2−e1) of the electric circuits 20 included in the identical column. In other words, for each number of columns of pixel circuits 10 equal to T, the columns of the electric circuits 20 to be connected change.

According to this embodiment, pixel circuits 10 for T−1 columns exist between two pixel circuits 10 (such as the e1-th column and the e2-th column) connecting to electric circuits 20 of an identical row (such as the p-th) and neighboring column (such as the v-th column and the w-th column).

The pixel circuits 10 of K columns are allocated to one of electric circuits 20 of each column. Therefore, T×U=K. In order to increase the degree of parallelism of signal processing, J≤K is favorable. Therefore, J≤T×U. Because T<J, U<K, T×U<J×K. Therefore, T×U−K<J×K−T×U is satisfied. Deforming this, T×U<(J+1)×K/2. Therefore, because J+1≈J, T×U<J×K/2. Therefore, when the connection method according to this embodiment is adopted, it is favorable to satisfy J≤T×U<J×K/2.

The idea of the first embodiment is to reduce the distance between two electric circuits 20 to which pixel circuits 10 of neighboring columns (such as the e1-th column and the f1-th column) are connected. In other words, each of close pixel circuits 10 is connected to close electric circuits 20. More specifically, this will be described with focus on pixel circuits 10 of 4 columns (such as the e1-th to h1-th columns) of an identical row (such as—the a-th) and electric circuits 20 four rows (such as the p-th to s-th) of an identical column (such as a v column) connected to the pixel circuits 10 of four columns. The pixel circuits 10 of middle columns (the f1-th column, the g1-th column) of pixel circuits 10 of 4 columns are close to the pixel circuits 10 (column (the e1-th column, the h1-th column) at both ends than the pixel circuits 10 of the column (the e1-th column, the h1-th column) of the pixel circuits 10 for 4 columns. The electric circuits 20 of the middle rows (the q-th, the r-th) of the electric circuits 20 for 4 rows are closer to the electric circuits 20 of the rows on the both ends (the p-th, the s-th) than the electric circuits 20 of the rows (the p-th, the s-th) of the electric circuits 20 four 4 rows. Then pixel circuits 10 of the middle columns (the f1-th column, the g1-th column) of the pixel circuits 10 for 4 columns are connected to electric circuits 20 of the middle column (the q-th column, the r-th column) of the electric circuits 20 for 4 rows. Thus, the order of the pixel circuits 10 for 4 columns and the order of the electric circuits 20 for 4 rows connected to the pixel circuits 10 for 4 columns are similar or are matched. This can result in a smaller influence on a difference in property of signal processing performed by the electric circuits 20. With respect to electric circuits 20 for four rows, a property difference between an electric circuit 20 of middle rows and an electric circuit 20 of one end row and a property difference between electric circuits 20 of the middle rows and the electric circuit 20 of the other end are called a first property difference. A property difference between the electric circuit 20 of the one end row and the electric circuit 20 of the other end row is called a second property difference. The property differences may be caused by a wiring length, and the two property differences of the electric circuits 20 are proportional to the distances. Therefore, the first property difference is smaller than the second property difference. With respect to pixel circuits 10 for 4 columns, an output difference between the pixel circuits 10 of the middle columns and the pixel circuit 10 of one end column and an output difference between the pixel circuits 10 of the middle columns and the pixel circuit 10 of the other end column corresponds to the first property difference. Therefore, in order to reduce the signal output difference corresponding to tow pixel circuits 10, as the distance between two pixel circuits 10 decreases, the distance between the corresponding two electric circuits 20 may be reduced. As a result, a high quality image with smaller shading can be acquired.

This corresponds to the fact that f1 and g1 are integers between e1 and h1, and q and r are integers between p and s. Particularly, g1 may be an integer between f1 and h1, and r may be an integer between q and s. f1 may be an integer between e1 and g1, and q may be an integer between p and r. Having exemplarily described the relationship between the pixel circuits 10 of the a-th row and the electric circuits 20 of the v-th column, the same is true in the b-th row, the c-th row, the d-th row, and the same is true in the w-th column, the x-th column, the y-th column, the z-th column.

Second Embodiment

Figure 3A:
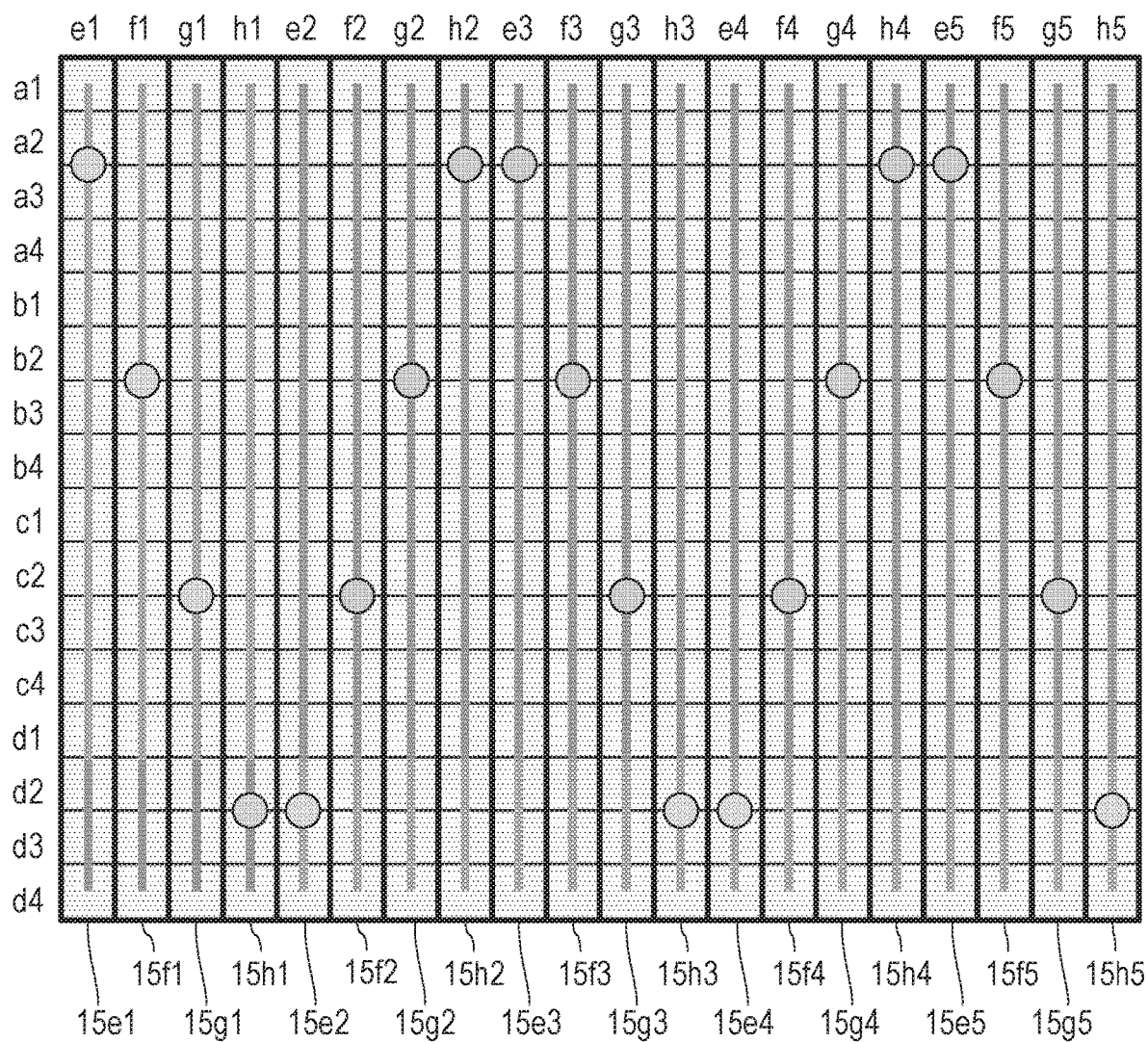

With reference to FIGS. 3A and 3B, a second embodiment will be described. Like numbers refer to like parts throughout, and any repetitive description will be omitted. FIG. 3A illustrates an arrangement of pixel circuits 10, like FIG. 2A, FIG. 3B illustrates an arrangement of electric circuits 20, like FIG. 2B. According to the second embodiment, the connection relationship between the electric circuits 20 of the w-th column and the y-th column is different from that of the first embodiment.

All pixel circuits 10 of an identical column belong to an identical pixel group 15. Therefore, all pixel circuits 10 of the g1-th column are connected to the electric circuit 20(r,v), and all pixel circuits 10 of the h1-th column are connected to the electric circuit 20(s,v). All pixel circuits 10 of the e2-th column are connected to the electric circuit 20(s,w), and all pixel circuits 10 of the f2-th column are connected to the electric circuit 20(r,w). All pixel circuits 10 of the g2-th column are connected to the electric circuit 20(q,w), and all pixel circuits 10 of the h2-th column are connected to the electric circuit 20(p,w). All pixel circuits 10 of the e3-th column are connected to the electric circuit 20(p,x), and all pixel circuits 10 of the f3-th column are connected to the electric circuit 20(q,x). All pixel circuits 10 of the g3-th column are connected to the electric circuit 20(r,x), and all pixel circuits 10 of the h3-th column are connected to the electric circuit 20(s,x).

With respect to the pixel circuits 10 of the e1-th column to the h1-th column, as the column number of the pixel circuit 10 increases, the row number of the corresponding electric circuit 20 increases from the p-th row to the s-th row. However, with respect to the pixel circuits 10 of the e2-th column to the h2-th column, as the column number of the pixel circuits 10 increases, the row number of the corresponding electric circuits 20 decreases from the s-th row to the p-th row. With respect to the pixel circuits 10 of the e3-th column to the h3-th column, as the column number of the pixel circuits 10 increases, the row number of the corresponding electric circuits 20 increases from the p-th row to the s-th row. With respect to the pixel circuits 10 of the e4-th column to the h4-th column, the column number of the pixel circuits 10 increases, the row number of the corresponding electric circuits 20 increases from the s-th row to the p-th correspondingly. In this manner, depending on increases of the column number of the pixel circuits 10, the row number of the corresponding electric circuit 20 periodically repeat increasing or decreasing.

The idea of the second embodiment is to reduce, more than the first embodiment, the distance between two electric circuits 20 to which pixel circuits 10 of neighboring columns (such as the h1-th column and the e2-th column) are connected. For example, the pixel group 15h1 is connected to the electric circuit 20(s, v), and the pixel group 15e2 neighboring to the pixel group 15h1 is connected to the electric circuit 20(s, w) neighboring to the electric circuit 20(s, v). The pixel group 15f2 is connected to the electric circuit 20(r, w), the pixel group 15g2 is connected to the electric circuit 20(q, w), and the pixel group 15h2 is connected to the electric circuit 20(p, w). The electric circuit 20 is of interest to which the pixel circuit 10 and the pixel circuits 10 of the e2-th column are connected. The h1-th column and the e2-th column are neighboring to each other. According to this example, the h1-th column and the e2-th column are adjacent to each other (e2=h1+1). However, a group of the h1-th column and the e2-th column is more neighboring than at least a group of the g1-th column and the f2-th column. The electric circuit 20(s, v) connecting to pixel group 15h1 of the h1-th column and the electric circuit 20(s, w) connecting to the pixel group 15e2 of the e2-th column are of an identical row (the s-th row). The electric circuit 20(s, v) and the electric circuit 20(s, w) are adjacent columns (the v-th column and the w-th column). Thus, it can be said that the electric circuit 20(s, v) and the electric circuit 20(s, w) are neighboring to each other. Thus, signals corresponding to neighboring pixel circuit 10 can be processed by the neighboring electric circuit 20 having a small property difference. Therefore, the output difference between signals corresponding to neighboring pixel circuits 10 can be reduced. As a result, a high-quality image with small shading can be acquired.

Third Embodiment

Figure 4A:
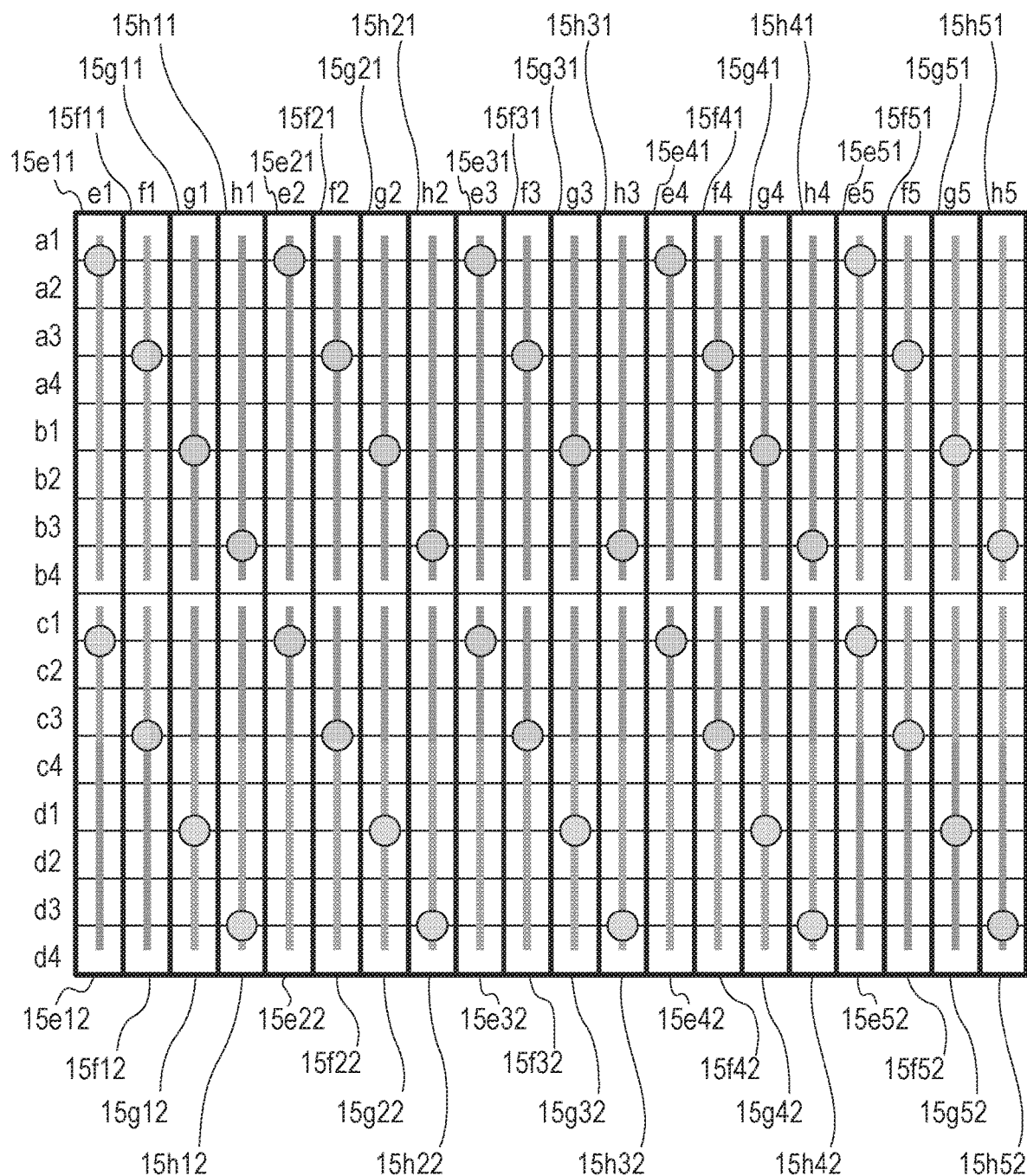
Figure 4B:
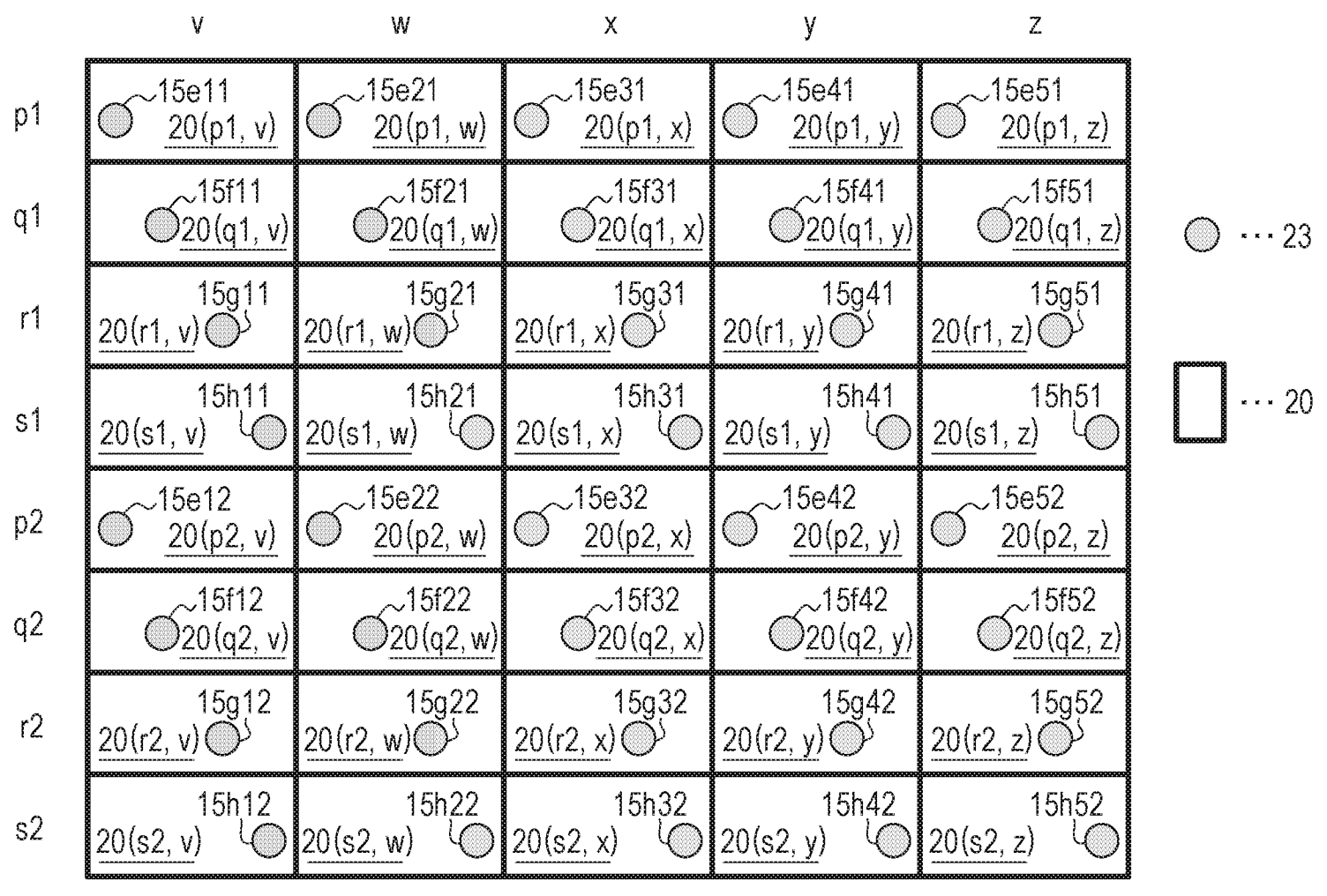

A third embodiment will be described with reference to FIGS. 4A and 4B. Like numbers refer to like parts throughout, and any repetitive descriptions will be omitted. FIG. 4A illustrates an arrangement of pixel circuits 10, like FIG. 2A, and FIG. 4B illustrates an arrangement of electric circuits 20, like FIG. 2B. According to the third embodiment, the electric circuits 20 are arranged in the p1-th to s1-th rows and the p2-th to s2-th rows. In this case, p1<q1<r1<s1<p2<q2<r2≤s2. According to the third embodiment, the a1-th row to the b4-th row of the pixel circuits 10 are allocated to pixel groups 15e11 to 15h51, and the c1-th row to the d4-th row of the pixel circuits 10 are allocated to pixel group 15e12 to 15h52. The pixel groups 15e11 to 15h51 are connected to the electric circuits 20 of the p1-th to s1-th rows and the v-th to z-th columns. For example, pixel circuits 10 (c, e1) of the c-th row and the e1-th columns are connected to an electric circuit 20 (p2, v) of the p2-th row and the v-th column. Pixel groups 15e12 to 15h52 are connected to the p2-th to s2-th rows and electric circuits 20 of the v-th to z-th columns. The pixel circuits 10(c, f1) of the c-th row and the f1-th columns are connected to the electric circuit 20 (q2, v) of the q2-th row and the v-th column. The pixel circuits 10 (c, g1) of the c-th row and the g1-th column are connected to the electric circuit 20 (r2, v) of the r2-th row and the v-th column. According to the third embodiment, pixel circuits 10 of an identical column can perform signal processing in parallel on electric circuits 20 of the p1-th to s1-th rows and the p2-th to s2-th rows of the electric circuit 20, which can increase the speed of the signal processing.

Fourth Embodiment

Figure 5A:
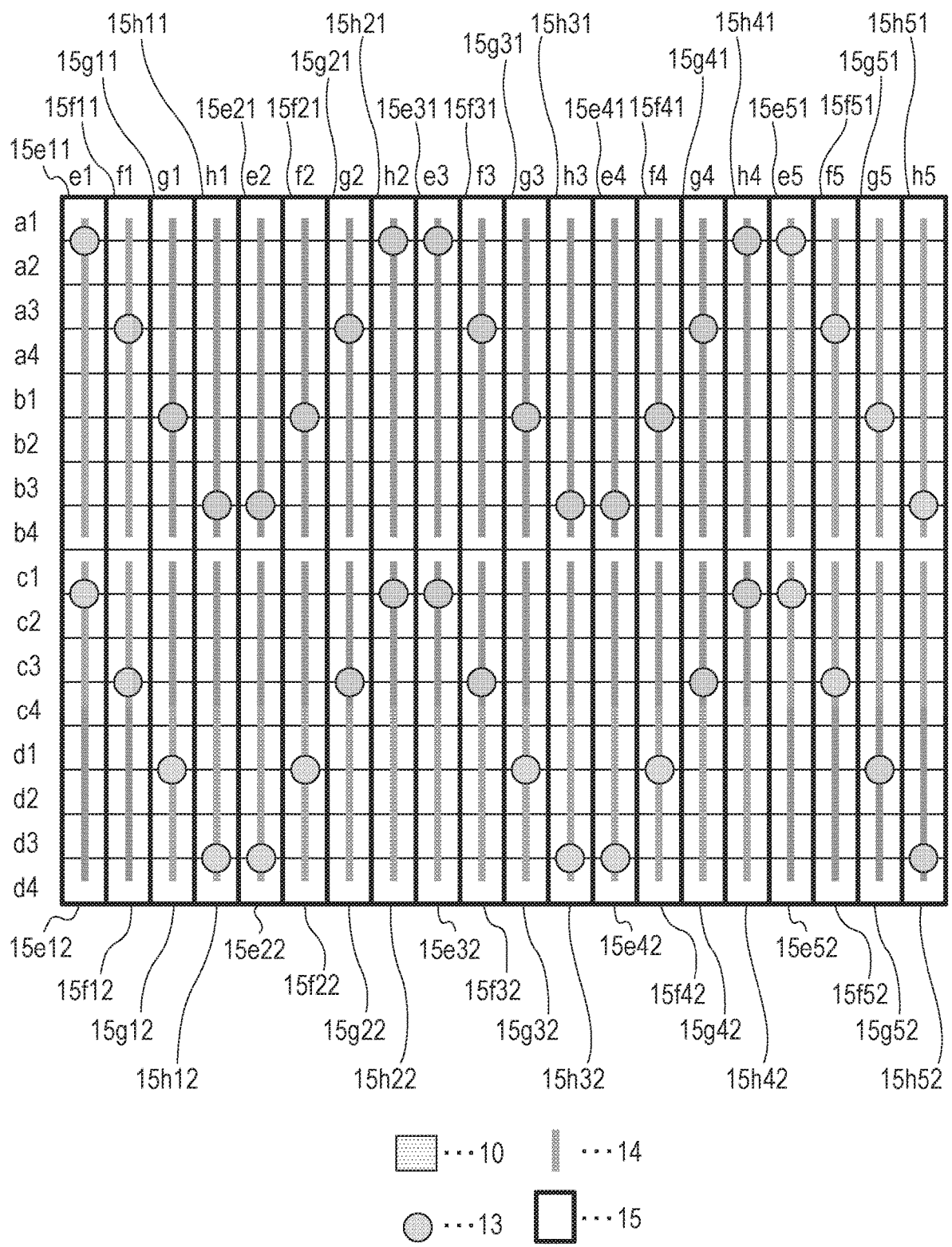

With reference to FIGS. 5A and 5B, a fourth embodiment will be described. Like numbers refer to like parts throughout, and any repetitive description will be omitted. FIG. 5A illustrates an arrangement of pixel circuits 10, like FIG. 2A, and FIG. 5B illustrates an arrangement of electric circuits 20, like FIG. 2B. According to the fourth embodiment, electric circuits 20 to which pixel groups including columns neighboring to each other of pixel circuits 10 are connected according to the third embodiment are arranged to be neighboring to each other like the second embodiment. In other words, a pixel group 15h11 and pixel group 15e21 that are neighboring to each other are connected to an electric circuit 20(s1, v) and an electric circuit 20(s1, w) of an identical row (the s1-th row). Also, the pixel group 15h12 and the pixel group 15e22 that are neighboring to each other are connected to the electric circuit 20(s2, v) and the electric circuit 20(s2, w) of the identical row (the s1-th row).

Fifth Embodiment

Figure 6A:
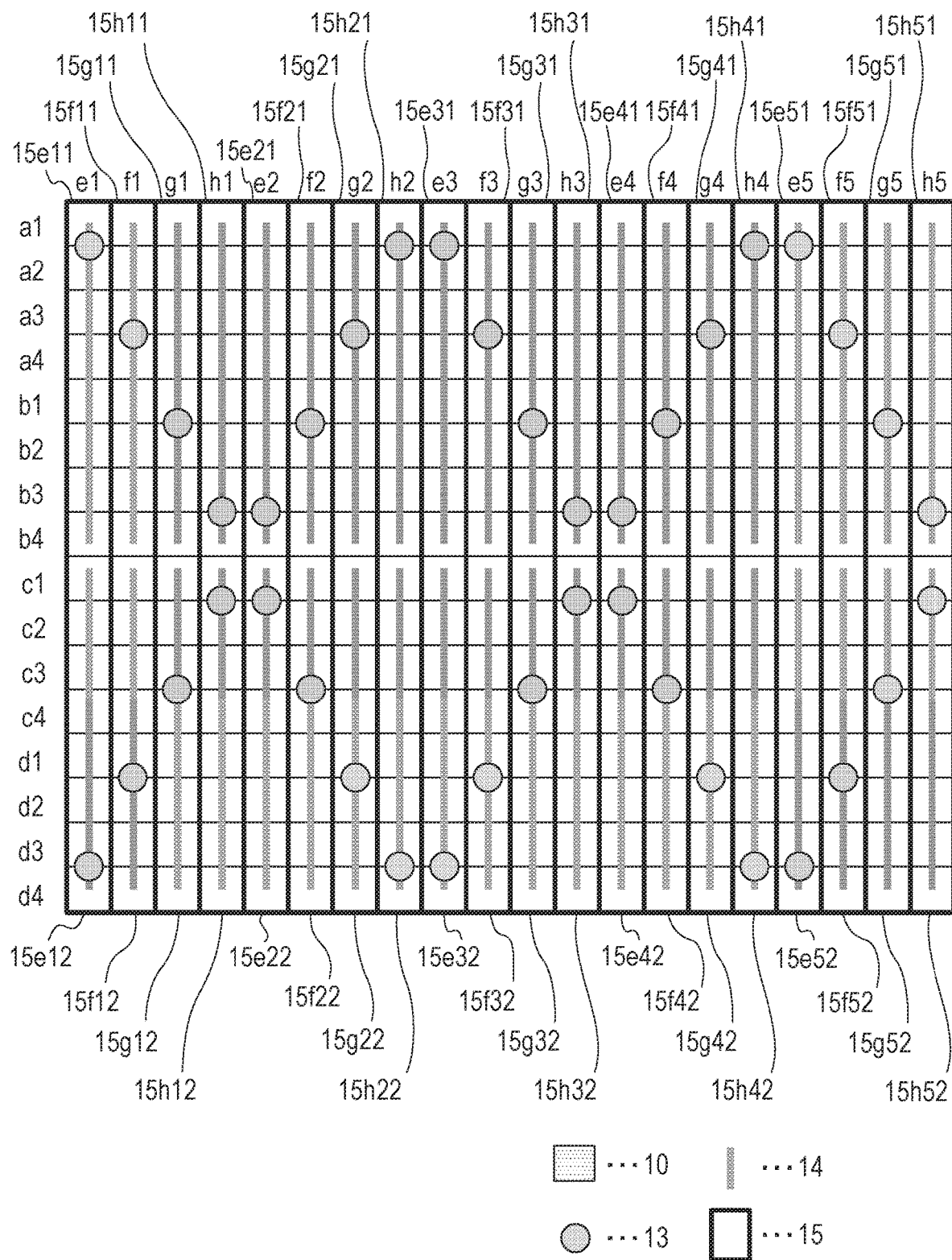

With reference to FIGS. 6A and 6B, a fifth embodiment will be described. Like numbers refer to like parts throughout, and any repetitive description will be omitted. FIG. 6A illustrates an arrangement of pixel circuits 10, like FIG. 2A, and FIG. 6B illustrates an arrangement of electric circuits 20, like FIG. 2B. According to the fifth embodiment, the electric circuit 20 having pixel groups neighboring and connected to each other according to the fourth embodiment are arranged to be neighboring to each other. In other words, pixel circuits 10 of an identical column (such as the h1-th column) are arranged, and the pixel group 15h11 and the pixel group 15h12 that are neighboring to each other are neighboring to each other. The pixel group 15h11 and the pixel group 15h12 are respectively connected to the electric circuit 20(s1, v) and the electric circuit 20(p2, v) of neighboring rows (the s1-th row and the p2-th row) of an identical column (the v-th column). In the same manner, the pixel group 15e21 and the pixel group 15e22 that are neighboring to each other are respectively connected to the electric circuit 20(s1, w) and the electric circuit 20(p2, w) of neighboring rows (the s1-th row and the p2-th row) of an identical column (the w-th column).

Sixth Embodiment

Figure 7:
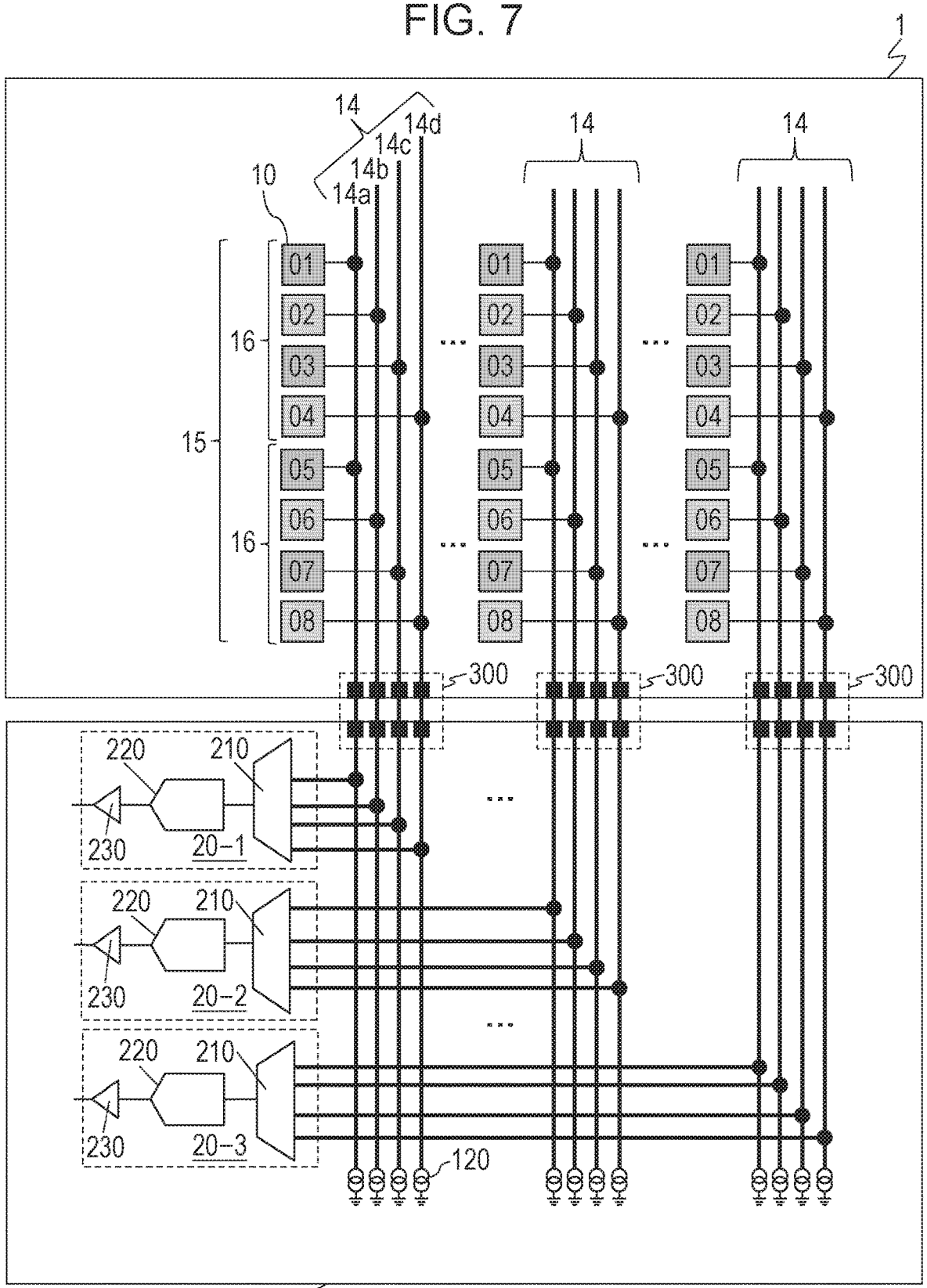
FIG. 7 is a schematic diagram illustrating an embodiment of a semiconductor apparatus.

A sixth embodiment have a common configuration to those of the first to fifth embodiments. FIG. 7 illustrates an equivalent circuit of the semiconductor apparatus illustrated in FIGS. 1A and 1B. FIG. 7 illustrates pixel circuits 10 of eight rows (such as the a1-th row to the b4-th row) and three columns (such as the e1-th column to g1-th column) of the pixel circuits 10 illustrated in FIGS. 2A and 2B. FIG. 7 further illustrates electric circuits 20 of three rows (such as the p-th to r-th row) and one column (such as the v-th column) of the electric circuits 20 illustrated in FIGS. 2A and 2B.

The pixel circuit 10 of the chip 1 has four ($\lambda$) signal lines 14a, 14b, 14c, 14d for pixel circuits 10 of one column. The signal lines 14a, 14b, 14c, and 14d will collectively be called a signal line 14. The pixel circuits 10 of the first row (the a1-th row) of the a-th row are connected to the signal line 14a. The pixel circuits 10 of the second, third, and four-th rows (the a2-th, a3-th, a4-th rows) of the a-th row are connected to the signal lines 14b, 14c, and 14d in the order. With respect to the pixel circuits 10 of the $\lambda$+first row and subsequent rows, the ($\rho \times \lambda$+1)-th pixel circuit 10 (where $\rho$ is a natural number) is connected to the signal line 14a. The pixel circuits 10 of the ($\rho\lambda$+2)-th row, the ($\rho\lambda$+3)-th row, and ($\rho\times\lambda$+4)-th row are connected to the signal lines 14b, 14c, 14d in the order. In a case where one column has J pixels, J/$\lambda$ pixel circuits 10 are commonly connected to one signal line 14a. The same connection relationship between the pixel circuits 10 and the signal line 14 is also true in another column of the pixel circuits 10.

A set of pixel circuits 10 connected to an identical electric circuit 20 will be called a pixel group 15. A set of $\lambda$ continuously arranged pixel circuits 10 connected to mutually different $\lambda$ signal lines will be called a pixel set 16. In this example, the pixel group 15 can include J rows of (J) pixels and J/$\lambda$ pixel sets 16. To one pixel group 15, all pixel circuits 10 belonging to the one pixel group 15 are connected to an identical electric circuit 20. To the identical electric circuit 20, pixel circuits 10 included in a pixel group 15 excluding the pixel group 15 are not connected.

A current source 120 is connected to the signal lines 14a to 14d of the signal line 14. The current source 120 is configured to supply electric current to the signal lines of the signal line 14 via a connecting unit 300. Although the current source 120 is provided in the chip 2, it may be provided in the chip 1.

Each of the signal lines 14 is connected to the electric circuits 20 via the connecting unit 300. In the example in FIG. 7, columns of the pixel circuits 10 is connected to different electric circuits 20-1, 20-2, and 20-3.

The electric circuit 20 has an input unit 210, a main unit 220, and an output unit 230. The input unit 210 has at least $\lambda$ input terminals. The $\lambda$ signal lines 14a, 14b, 14c, and 14d included in the signal line 14 are connected to $\lambda$ input terminals of the input unit 210. The main unit 220 is configured to process signals from the pixel circuit 10, for example. Therefore, the main unit 220 can be called a signal processing unit. The input unit 210 is configured to sequentially select the signal line 14a, 14b, 14c, and 14d of the signal line 14, and the main unit 220 is configured to sequentially process signals of the signal lines 14a, 14b, 14c, and 14d. The output unit 230 is configured to output a signal from the electric circuit 20.

FIG. 7 illustrates sequence numbers 01 to 08 for signals to be processed with respect to a plurality of pixel circuits 10. First, the first pixel set 16 is selected by a scanning circuit, not illustrated. For example, signals of pixel circuits 10 of the ($\rho \times \lambda +1$)-th row, signals of pixel circuits 10 of the ($\rho \times \lambda +2$)-th row, signals of pixel circuits 10 of the ($\rho \times \lambda +3$)-th row, signals of pixel circuits 10 of the ($\rho \times \lambda +4$)-th row are sequentially processed (sequence numbers 01 to 04). Next, the next pixel set 16 is selected by the scanning circuit, not illustrated. In other words, signals of pixel circuits 10 of (($\rho +1$)$\times \lambda +1$)-th row, signals of pixel circuits 10 of (($\rho +1$)$\times \lambda +2$)-th row, signals of pixel circuits 10 of (($\rho +1$)$\times \lambda +3$)-th row, signals of pixel circuits 10 of (($\rho +1$)$\times \lambda +4$)-th row are read out to the signal lines 14. Then, the input unit 210 and the main unit 220 sequentially process (sequence numbers 05 to 08) signals of pixel circuits 10 of (($\rho +1$)$\times \lambda +2$)-th row, signals of pixel circuits 10 of (($\rho +1$)$\times \lambda +3$)-th row, signals of pixel circuits 10 of (($\rho +1$)$\times \lambda +4$)-th row.

Signals from pixel circuits 10 of an identical row are processed in parallel by a plurality of electric circuits 20 corresponding to the pixel circuits 10 of the columns. For example, signals from the pixel circuits 10 of the ($\rho \times \lambda +1$)-th row to ($\rho \times \lambda +4$)-th row can be processed in parallel between the electric circuit 20-1, the electric circuit 20-2, and the electric circuit 20-3. Also, signals of pixel circuits 10 of the (($\rho +1$)$\times \lambda +1$)-th row to (($\rho +1$)$\times \lambda +4$)-th row can be processed in parallel among the electric circuit 20-1, the electric circuit 20-2, and the electric circuit 20-3. The processing on signals from the pixel circuits 10 of the ($\rho \times \lambda +1$)-th row to ($\rho \times \lambda +4$)-th row is performed at a different time from the processing on the signals from the pixel circuits 10 of the (($\rho +1$)$\times \lambda +1$)-th row to (($\rho +1$)$\times \lambda +4$)-th row.

Figure 8:
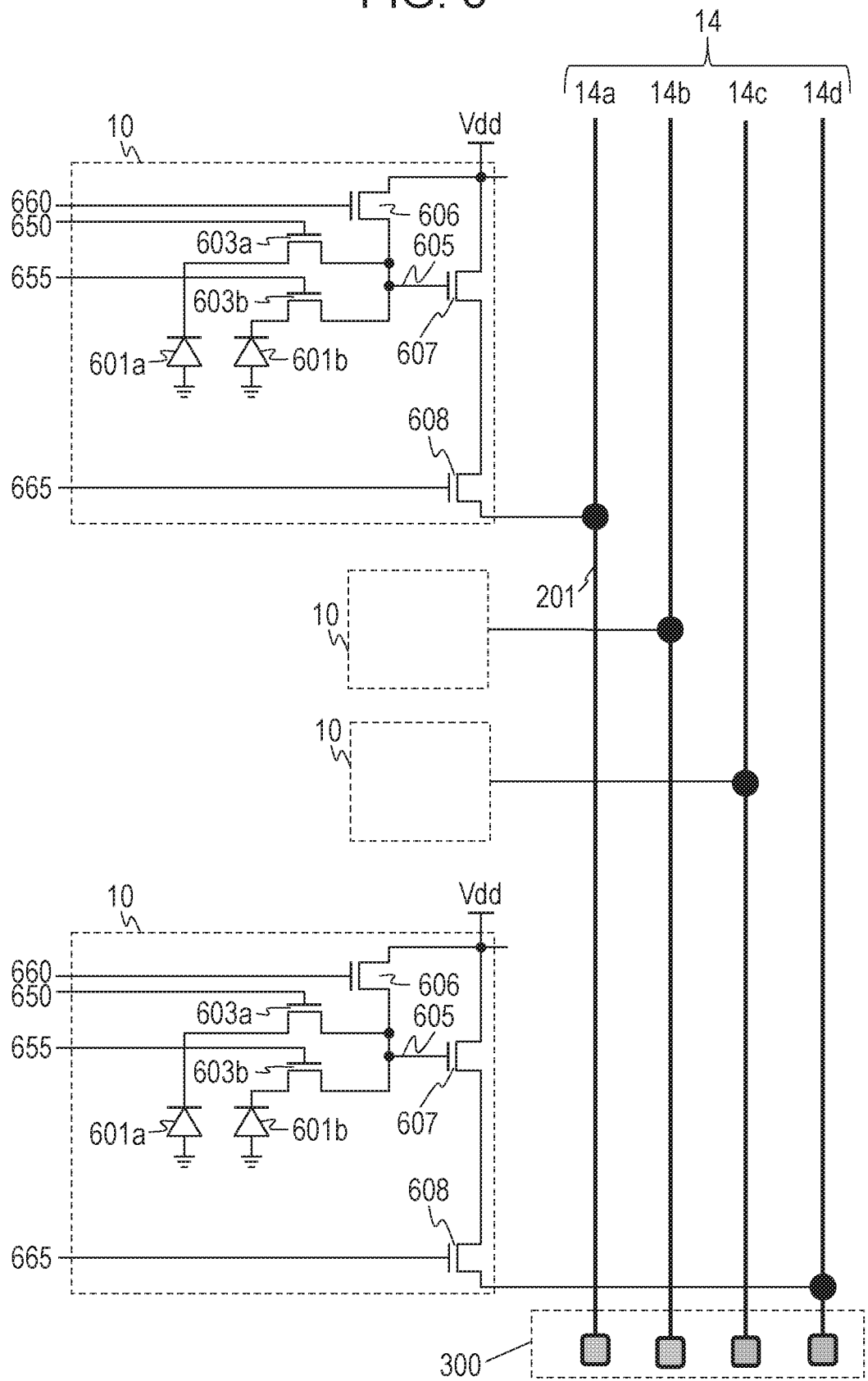
FIG. 8 is a schematic diagram illustrating an embodiment of a semiconductor apparatus.

FIG. 8 illustrates an example of equivalent circuits of the pixel circuits 10. Each of the pixel circuits 10 has photoelectric conversion elements 601a and 601b that are photodiodes. The photoelectric conversion elements 601a and 601b receive light transmitted through one microlens, not illustrated, and a color filter. In other words, the light incident on the photoelectric conversion element 601a has a substantially different wavelength from that of the light incident on the photoelectric conversion element 601b. The photoelectric conversion element 601a is connected to an electric charge detection unit 605 through a transfer transistor 603a. The electric charge detection unit 605 has a floating diffusion structure. The transfer transistor 603a has a gate connected to a scanning circuit, not illustrated, through a control line 650. The photoelectric conversion element 601b is connected to the electric charge detection unit 605 through the transfer transistor 603b. The transfer transistor 603b has a gate connected to a scanning circuit, not illustrated, through a control line 655.

The electric charge detection unit 605 is connected to a reset transistor 606 and a gate of an amplification transistor 607. The reset transistor 606 and the amplification transistor 607 receive power supply voltage Vdd. The reset transistor 606 has a gate connected to a scanning circuit, not illustrated, through the control line 660.

The amplification transistor 607 is connected to a selection transistor 608. The selection transistor 608 has a gate connected to a vertical scanning circuit, not illustrated, through a control line 665. The selection transistor 608 is connected to any one signal line of the signal lines 14. The semiconductor element to be connected to the conductor 13 according to this embodiment is the selection transistor 608 or, if the selection transistor 608 is omitted, it is the amplification transistor 607.

Figure 9:
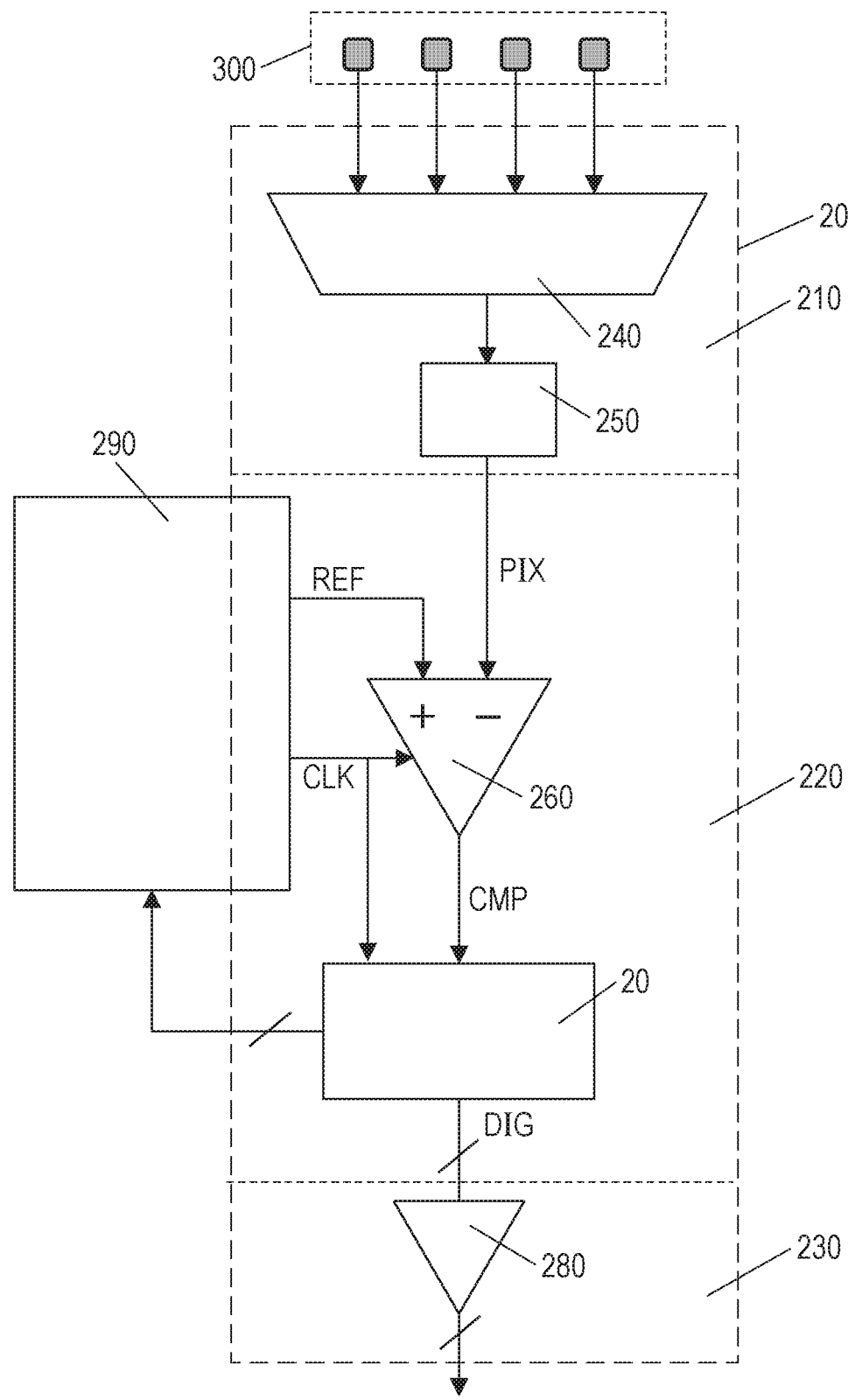
FIG. 9 is a schematic diagram illustrating an embodiment of a semiconductor apparatus.

FIG. 9 illustrates an example of an equivalent circuit of the electric circuit 20. A selection circuit 240 provided in the input unit 210 may be a multiplexer, for example. The semiconductor element connected to the conductor 23 can possibly be an input transistor of the multiplexer according to this embodiment. The electric circuit 20 in this example can include a successive approximation register (SAR) analog-digital converter as the main unit 220. A pixel signal PIX selected by the selection circuit 240 is input to an inverting input terminal(−) of a comparator circuit 260 in the main unit 220 through an auxiliary circuit 250 provided in the input unit 210. The auxiliary circuit 250 may be a sample/hold circuit and/or an amplifying circuit. A reference signal REF is input to a non-inverting input terminal (+) of the comparator circuit 260. The reference signal REF is supplied from a signal generating circuit 290. The signal generating circuit 290 can include a digital-analog converter (DAC). A part of the signal generating circuit 290 may be included in the electric circuits 20 arranged in a matrix form, and the remaining part may be arranged in a peripheral area PR (see FIGS. 1A and 1B). The comparator circuit 260 outputs a comparison signal CMP indicative of a comparison result being a magnitude relationship between the pixel signal PIX and the reference signal REF. The comparison signal CMP is stored by a storage circuit 270. The storage circuit 270 may be a digital memory. The comparator circuit 260 and the storage circuit 270 is synchronized with a synchronization signal CLK from the signal generating circuit 290. The signal generating circuit 290 can operate in accordance with the signal stored in the storage circuit 270. The storage circuit 270 holds a digital signal DIG. The output unit 230 includes a selection transistor to be selected by a scanning circuit (not illustrated), and when the selection transistor selected by the scanning circuit is turned on, data from a desired electric circuit 20 can be read out from a readout circuit (not illustrated). A digital signal (data) is output from an output circuit 280 provided in the output unit 230. The output circuit 280 may include a sensing amplifier, for example. The output circuit 280 can include a parallel-serial converter and an interface circuit configured to communicate Low Voltage Differential Signaling (LVDS). However, these interface circuits may be provided externally to the electric circuit 20.

A reference signal REF1 having a first signal level is input, and a first comparison signal CMP1 indicative of the comparison result is stored in memory as a higher order bit. Next, a reference signal REF2 having a second signal level different from the first signal level based on the first comparison signal CMP1 is input, and a second comparison signal CMP2 indicative of the comparison result is stored in memory as a middle order bit. Next, a reference signal REF3 having a third signal level different from the second signal level based on the second comparison signal CMP2 is input, and a third comparison signal CMP3 indicative of the comparison result is stored in memory as a lower order bit. In this manner, a plurality of comparisons are repeated so that digital signals DIG having a plurality of bits can be acquired.

It should be noted that the electric circuit 20 can perform inclination analog-digital conversion. In this case, the signal generating circuit 290 generates a ramp signal as a reference signal REF and a count signal (not illustrated). The comparator circuit 260 is configured to inversion an output of a comparison signal CMP when the comparison result between the reference signal REF and the pixel signal PIX changes. When the comparison signal CMP is inverted, the storage circuit 270 obtains a count signal so that a digital signal DIG corresponding to the count value of the count signal can be obtained.

Seventh Embodiment

Examples of operations to be performed by the semiconductor apparatus according to the sixth embodiment will be described according to a seventh embodiment. The operations illustrated in FIGS. 10A and 10B include a plurality of operations to be performed in parallel:
(1) Parallel operations of reading of N signals corresponding to pixel circuits 10 of a first row and reading of N signals corresponding to pixel circuits 10 of a second row;
(2) Parallel operations of an AD conversion of N signals corresponding to pixel circuits 10 of the first row and reading of N signals corresponding to the pixel circuits 10 of the second row;
(3) parallel operations of AD conversion on N signals corresponding to the pixel circuits 10 of a fourth row and reading of A+B signals corresponding to the pixel circuits 10 of the first row;
(4) parallel operations of reading of A+B signals corresponding to the pixel circuits 10 of the first row and reading of A+B signals corresponding to the pixel circuits 10 of the second row; and
(5) Parallel operations of AD conversion on A+B signals corresponding to the pixel circuits 10 of the first row and reading of A+B signals corresponding to the pixel circuits 10 of the second row.

These parallel operations can reduce a waiting time from a time when the main unit 220 performs one AD conversion to the time when the main unit 220 performs the next AD conversion. This can reduce the period for AD conversion of signals to be output by all pixel circuits 10. An increased frame rate of a semiconductor apparatus APR can further be advanced.

A case will be described in which a focus detection mode and an image capturing mode are both performed as operations of an imaging apparatus.

Figure 10B:
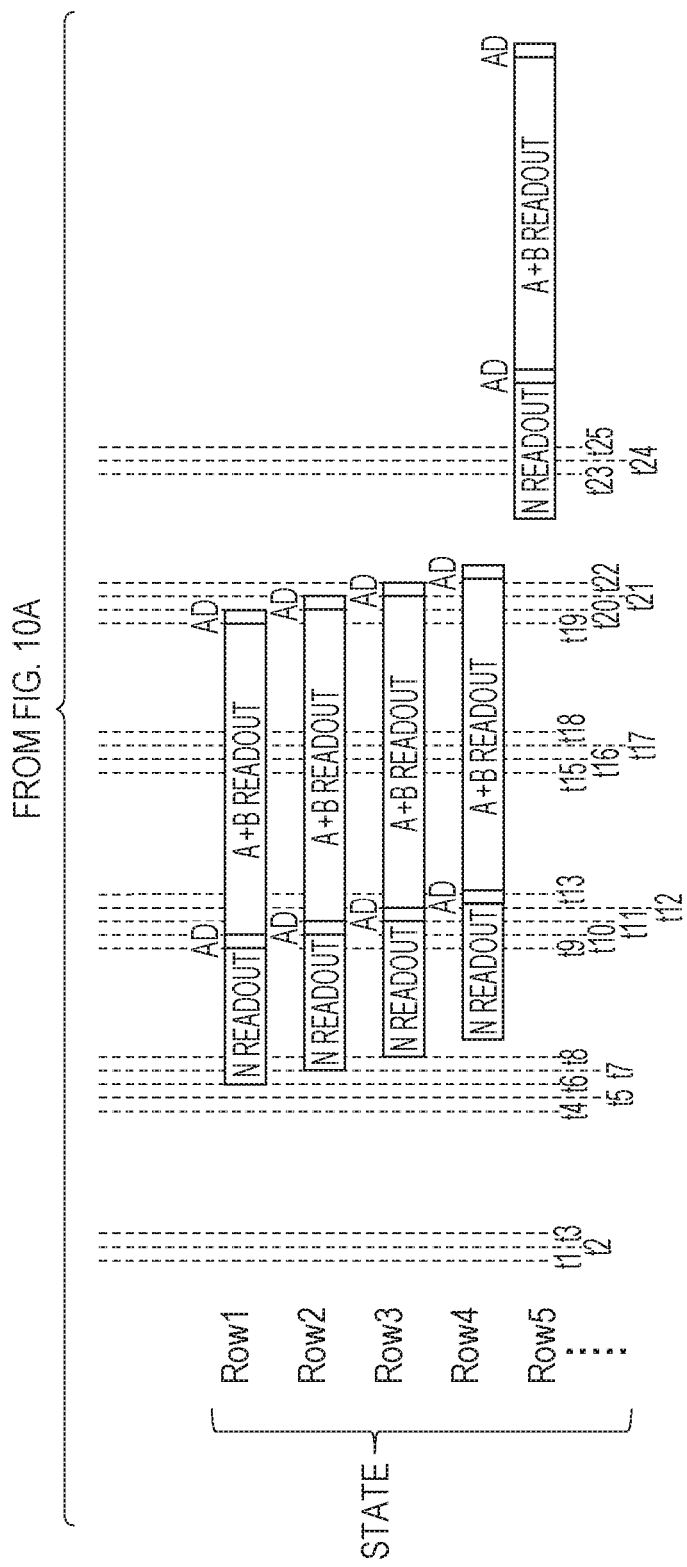
Figure 11A:
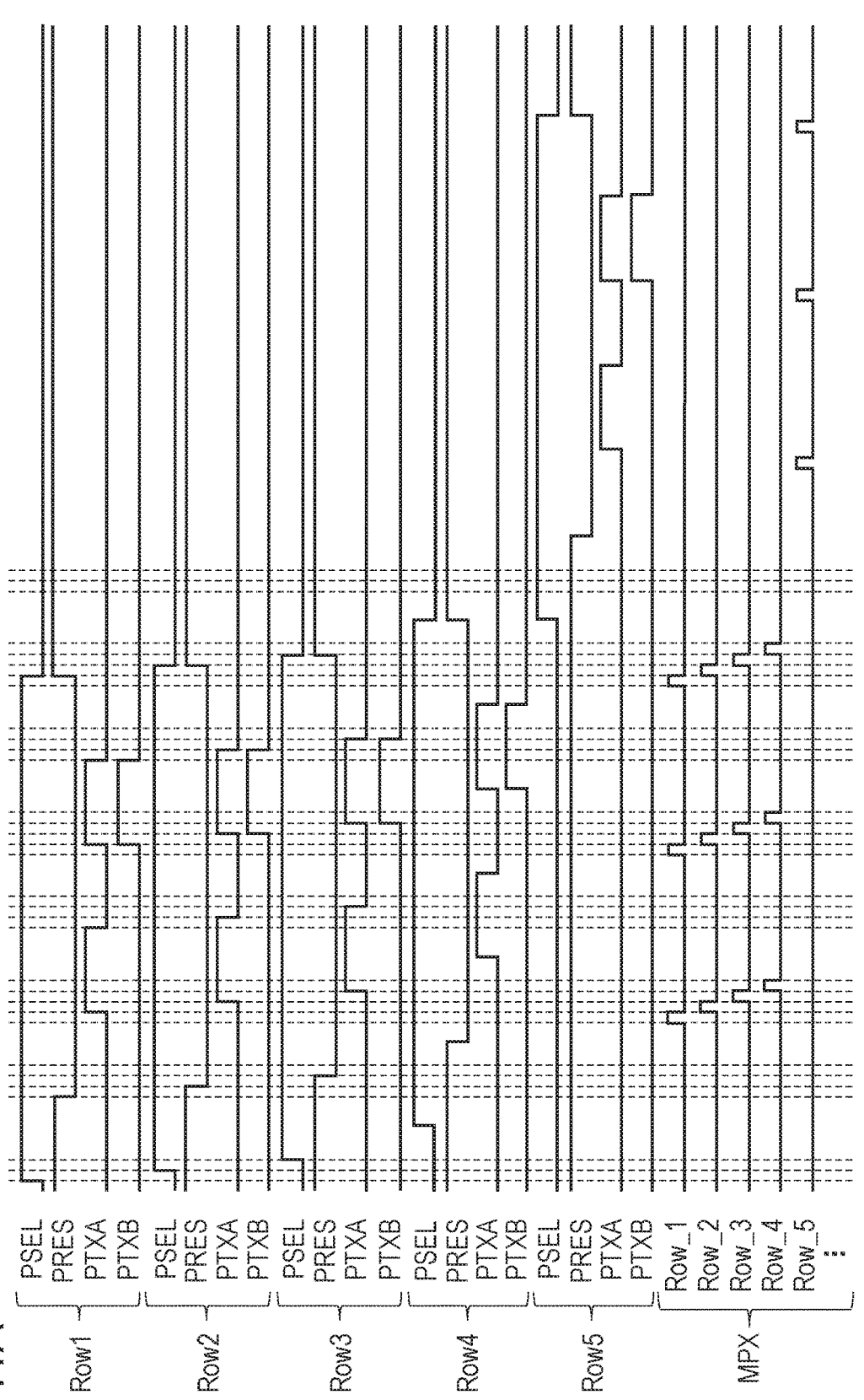
FIGS. 11A and 11B are a schematic diagram illustrating an embodiment of a semiconductor apparatus.
Figure 11B:
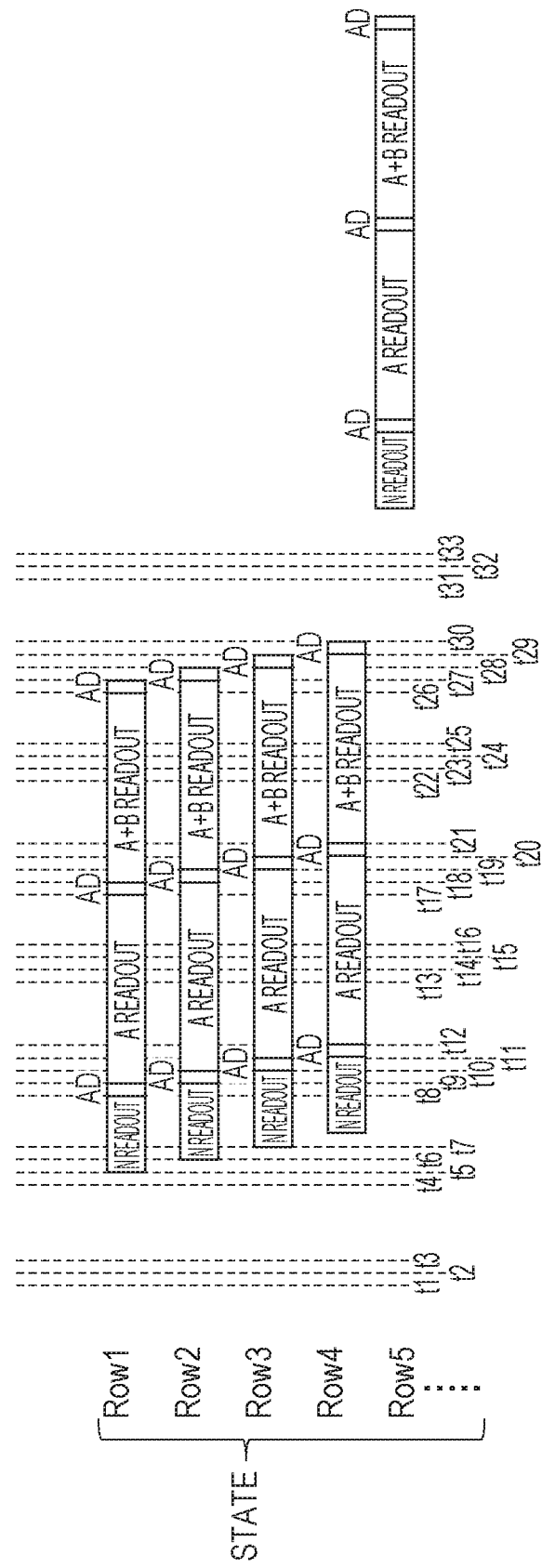

FIGS. 11A and 11B illustrate operations for outputting signals for focus detection by a semiconductor apparatus APR and for outputting signals for image capturing. Differences from the operations illustrated in FIGS. 10A and 10B will mainly be described below.

The operation for reading N signals from pixel circuits 10 from rows is the same operation as illustrated in FIGS. 10A and 10B. The operation for AD conversions on N signals from pixel circuits 10 from rows is the same operation as illustrated in FIGS. 10A and 10B.

An operation for reading out A signals corresponding to the pixel circuits 10 of each row will be described. At a time t9, the vertical scanning circuit changes signal PTXAs to be output to the pixel circuits 10 of the first row to High level. Thus, electric charges accumulated in the photoelectric conversion element 601a are transferred to the electric charge detection unit 605 through the transfer transistor 603a. Thus, the electric charge detection unit 605 can have a potential corresponding to the electric charges in the photoelectric conversion element 601a. The signal line 14a of each column receive the A signals of the pixel circuits 10 of the first row. The A signal is a first signal based on a signal of a part of photoelectric conversion elements of a plurality of photoelectric conversion elements. The first signal can be used as a signal for focus detection.

At a time t10, the vertical scanning circuit changes a signal PTXA to be output to the pixel circuits 10 of the second row to High level. Thus, the signal line 14b of each column receives the A signal of the pixel circuits 10 of the second row.

At a time t11, the vertical scanning circuit changes a signal PTXA to be output to the pixel circuits 10 of a third row to High level. Thus, the signal line 14c of each column receives A signals of the pixel circuits 10 of the third row.

at a time t12, the vertical scanning circuit changes signal PTXA to be output to the pixel circuits 10 of the fourth row to High level. Thus, the signal line 14d of each column receives A signals of the pixel circuits 10 of the fourth row.

Operations for AD conversion to be performed on A signals corresponding to pixel circuits 10 of each row will be described.

At a time t17, the input unit 210 outputs signals of the signal line 14a, that is, A signals of the pixel circuits 10 of the first row to the main unit 220. The main unit 220a converts A signals from the pixel circuits 10 of the first row to digital signals.

At a time t18, the input unit 210 outputs signals of the signal line 14b, that is, A signals of the pixel circuits 10 of the second row to the main unit 220. The main unit 220 converts the A signals of the pixel circuits 10 of the second row to digital signals.

At a time t19, the input unit 210 outputs signals of the signal line 14c, that is, A signals of the pixel circuits 10 of the third row to the main unit 220. The main unit 220 converts A signals of the pixel circuits 10 of the third row to digital signals.

At a time t20, the input unit 210a outputs signals of the signal line 14d, that is A signals of the pixel circuits 10 of the fourth row to the main unit 220. The main unit 220 converts the A signals of the pixel circuits 10 of the fourth row to digital signals.

The operation for reading A+B signals of the pixel circuits 10 of each row will be described.

At a time t18, the vertical scanning circuit changes signals PTXA, PTXB to be output to pixel circuits 10 of the first row to High level. Thus, the electric charges accumulated in the photoelectric conversion elements 601a, 601b are transferred to the electric charge detection unit 605 through the transfer transistors 603a, 603b. Thus, the signal line 14a receives A+B signals of the pixel circuits 10 of the first row.

At a time t19, the vertical scanning circuit changes signals PTXA, PTXB to be output to the pixel circuits 10 of the second row to High level. Thus, the electric charges accumulated in the photoelectric conversion elements 601a, 601b are transferred to the electric charge detection unit 605 through the transfer transistors 603a, 603b. Thus, the signal line 14b receives A+B signals of the pixel circuits 10 of the second row.

At a time t20, the vertical scanning circuit changes signals PTXA, PTXB to be output to the pixel circuits 10 of the third row to High level. Thus, the electric charge accumulated in the photoelectric conversion elements 601a, 601b are transferred to the electric charge detection unit 605 through the transfer transistors 603a, 603b. Thus, the signal line 14c receives A+B signals of pixel circuits 10 of the third row.

At a time t21, the vertical scanning circuit changes signal PTXA, PTXB to be output to the pixel circuits 10 of the fourth row to High level. Thus, the electric charges accumulated in the photoelectric conversion elements 601a, 601b are transferred to the electric charge detection unit 605 through the transfer transistors 603a, 603b. Thus, the signal line 14d receives A+B signals of the pixel circuits 10 of the fourth row.

Operations for AD conversion on A+B signals in the pixel circuit 10 of each row will be described.

At a time t26, the input unit 210 outputs signals of the signal line 14a, that is, A+B signals of the pixel circuits 10 of the first row to the main unit 220. The main unit 220 converts A+B signals of the pixel circuits 10 of the first row to digital signals.

At a time t27, the input unit 210a outputs signals of the signal line 14b, that is, A+B signals of the pixel circuits 10 of the second row to the main unit 220. The main unit 220 converts A+B signals of the pixel circuits 10 of the second row to digital signals.

At a time t28, the input unit 210a outputs signals of the signal line 14c, that is, A+B signals of the pixel circuits 10 of the third row to the main unit 220. The main unit 220 converts A+B signals of the pixel circuits 10 of the third row to digital signals.

At a time t29, the input unit 210a outputs signals of the signal line 14d, that is, A+B signals of the pixel circuits 10 of the fourth row to the main unit 220. The main unit 220 converts A+B signals of the pixel circuits 10 of the fourth row to digital signals.

After that, the vertical scanning circuit changes signals PSEL(5) of the pixel circuits 10 of the fifth row to High level. Subsequently, the same operations are repeated.

In this manner, the imaging apparatus according to this embodiment can acquire digital signals based on N signals of pixels, digital signals based on A signals of the pixels and digital signals based on A+B signals of the pixel.

This embodiment can achieve increased speed because of parallel operations performed by the semiconductor apparatus APR including operations illustrated in FIGS. 11A and 11B. The operations illustrated in FIGS. 11A and 11B include a plurality of operation to be performed in parallel.

(1) Parallel operations of reading of N signals corresponding to pixel circuits 10 of a first row and reading of N signals corresponding to pixel circuits 10 of a second row;
(2) Parallel operations of an AD conversion of N signals corresponding to pixel circuits 10 of the first row and reading of N signals corresponding to the pixel circuits 10 of the second row;
(3) parallel operations of AD conversion on N signals corresponding to the pixel circuits 10 of a fourth row and reading of A signals corresponding to the pixel circuits 10 of the first row;
(4) Parallel operations of reading of A signals corresponding to pixel circuits 10 of a first row and reading of A signals corresponding to pixel circuits 10 of a second row;
(5) Parallel operations of an AD conversion of A signals corresponding to pixel circuits 10 of the first row and reading of A signals corresponding to the pixel circuits 10 of the second row;
(6) parallel operations of AD conversion on A signals corresponding to the pixel circuits 10 of a fourth row and reading of A+B signals corresponding to the pixel circuits 10 of the first row;
(7) parallel operations of reading of A+B signals corresponding to the pixel circuits 10 of the first row and reading of A+B signals corresponding to the pixel circuits 10 of the second row; and
(8) parallel operations of AD conversion on A+B signals corresponding to the pixel circuits 10 of the first row and reading of A signals corresponding to the pixel circuits 10 of the second row.

These parallel operations can reduce a waiting time from a time when the main unit 220 performs one AD conversion to the time when the main unit 220 performs the next AD conversion. This can reduce the period for AD conversion of signals to be output by all pixel circuits 10. An increased frame rate of an imaging apparatus can further be advanced.

This embodiment is not limited to this example. For example, it may be configured such that, during one frame period, pixels having a color filter for a first color can be connected, and pixels having a color filter for a second color cannot be connected. Describing with focus on pixels of one column having R and G color filters, the input unit 210 connects signal lines 14a, 14c connecting to pixels having a color filter for R that is the first color to the main unit 220. On the other hand, during the one frame period, the input unit 210 may not connect the signal lines 14b, 14d connecting to pixels having a color filter for G that is a second color to the main unit 220. In this configuration, signals of pixels to be input to the main unit 220 can be handled as signals corresponding to one color only. This advantageously can simplify correction of the AD conversion performed by the main unit 220 and simplify corrects after the AD conversion.

Having described that, according to this embodiment, one electric circuit 20 is provided correspondingly to pixel circuits 10 of one column, embodiments of the present disclosure are not limited to this example. A plurality of electric circuits 20 can be provided for pixel circuits 10 of one column. For example, electric circuits 20 connected to the signal lines 14a, 14b is provided separately from other electric circuits 20 connected to the signal lines 14c, 14d. A plurality of pixel columns may share one electric circuit 20.

Eighth Embodiment

Figure 12A:
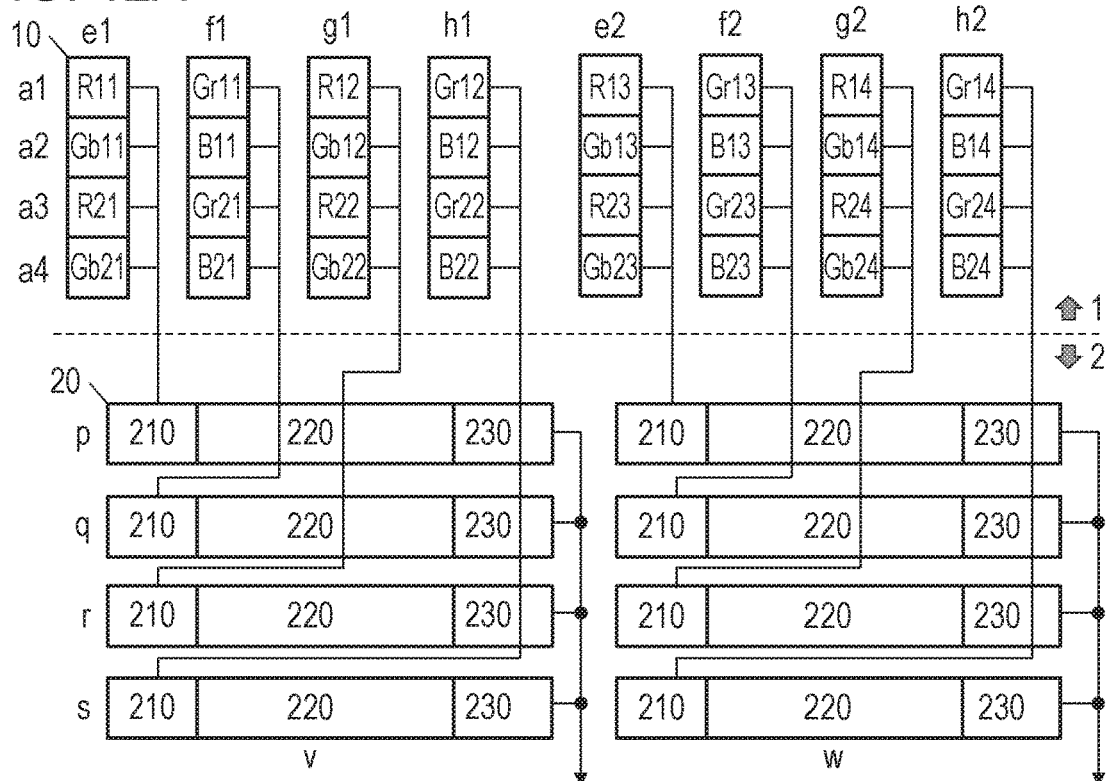
FIGS. 12A and 12B are schematic diagrams illustrating an embodiment of a semiconductor apparatus.
Figure 12B:
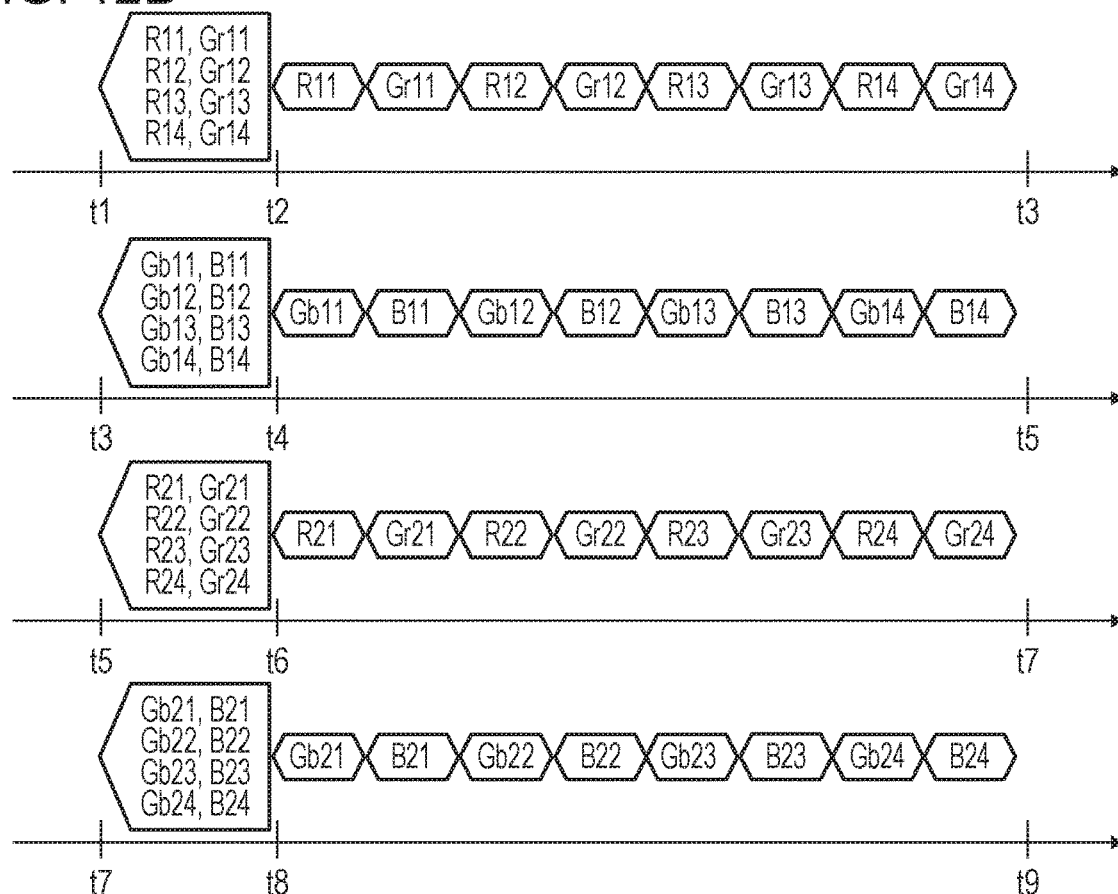

With reference to FIGS. 12A and 12B, an eighth embodiment will be described. Like numbers refer to like parts throughout, and any repetitive description will be omitted. The eighth embodiment has a common configuration as those of the first to seventh embodiments. The eighth embodiment relates to a signal output from the electric circuit 20 after the electric circuit 20 performs processing thereon. FIG. 12A illustrates a connection relationship between pixel circuit 10 and electric circuit 20, and FIG. 10B illustrates outputs from the electric circuits 20.

FIG. 12A illustrates pixel circuits 10 of the a1-th row to the a4-th row, the e1-th to the h4-th column. FIG. 12A further illustrates electric circuits 20 of the p-th to s-th rows and the v-th row and w-th column. Referring to FIG. 12A, references such as signal R11, Gr11 are given to signals generated by the pixel circuits 10. References R, B, Gr, Gb corresponds to colors represented by signals, and R is red color, B is blue color, and Gr and G are green color though colors represented by signals are not limited thereto. The connection relationship between pixel circuit 10 and electric circuit 20 is the same as that of the first to seventh embodiments.

While signals are processed in parallel in a plurality of electric circuits 20, signals are read out from a plurality of electric circuit 20 by sequentially selecting electric circuits 20 to output signals.

FIG. 12B illustrates timing of signal processing in the electric circuits 20 and signal output from the electric circuit 20. At times t1 to t2, signal R11, Gr11, R12, G12, R13, Gr13, R14, Gr14 from the pixel circuits 10 of the a1-th row are processed in parallel in the electric circuits 20. Next, at times t2 to t3, electric circuits 20 to output signals are sequentially selected. According to this embodiment, the f1-th column and the g1-th column are read out from the e1-th column in increasing order of column numbers from the pixel circuits 10 of the a1-th row. In other words, signals R11, Gr11, R12, G12, R13, Gr13, R14, Gr14 are read out in this order. Next, at times t3 to t4, signal Gb11, B11, Gb12, B12, Gb13, B13, Gb14, B14 of the pixel circuits 10 of the a2-th row are processed in parallel in the electric circuits 20. Next, at times t4 to t5, electric circuit 20 to output signals are sequentially selected. According to this embodiment, the f1-th column and the fg1-th column are read out in increasing order of column number from the e1-th column from pixel circuits 10 of the a2-th row. In other words, signals Gb11, B11, Gb12, B12, Gb13, B13, Gb14, B14 are read out in this order. In the same manner, signals of the pixel circuits 10 of the a3-th row are processed in parallel at times t5 to t6, and the signals of the pixel circuits 10 of the a3-th row are sequentially output from the e1-th column in increasing order of column number at times t6 to t7. At times t7 to t8, signals of the pixel circuits 10 of the a4-th row are processed in parallel. At times t8 to t9, signals of the pixel circuits 10 of the a4-th row are output from the e1-th column sequentially in increasing order of column number.

In this way, in a case where signals corresponding to pixel circuits 10 of an identical row are read out in order of columns of the pixel circuits 10, the signals corresponding to the pixel circuits 10 of the identical row can be processed in parallel. In this case, as mainly described according to the first embodiment, because four columns of the pixel circuits 10 and four rows of the corresponding electric circuits 20 are aligned in the same order so that the influence of the property difference of the electric circuit 20 can be reduced.

According to the eighth embodiment, to read out data corresponding to a plurality of pixel circuits 10, data of pixel circuits 10 of an identical row (such as the a1-th row) are read out from the electric circuit 20 of a plurality of columns (such as the v-th column and the w-th column). After that, data of the pixel circuits 10 of another row (such as the a2-th row) are read out. Thus, because data of the pixel circuits 10 can be output row by row of the pixel circuit 10, data communication and image processing can be performed at a high speed and efficiently.

In a case where the connection configuration like the second embodiment is applied, data may be output from a proper electric circuit 20 connecting to a pixel circuit 10 such that data of the pixel circuit 10 of an identical row (such as the a1-th row) can be output in column order of the pixel circuits 10.

Ninth Embodiment

Figure 13A:
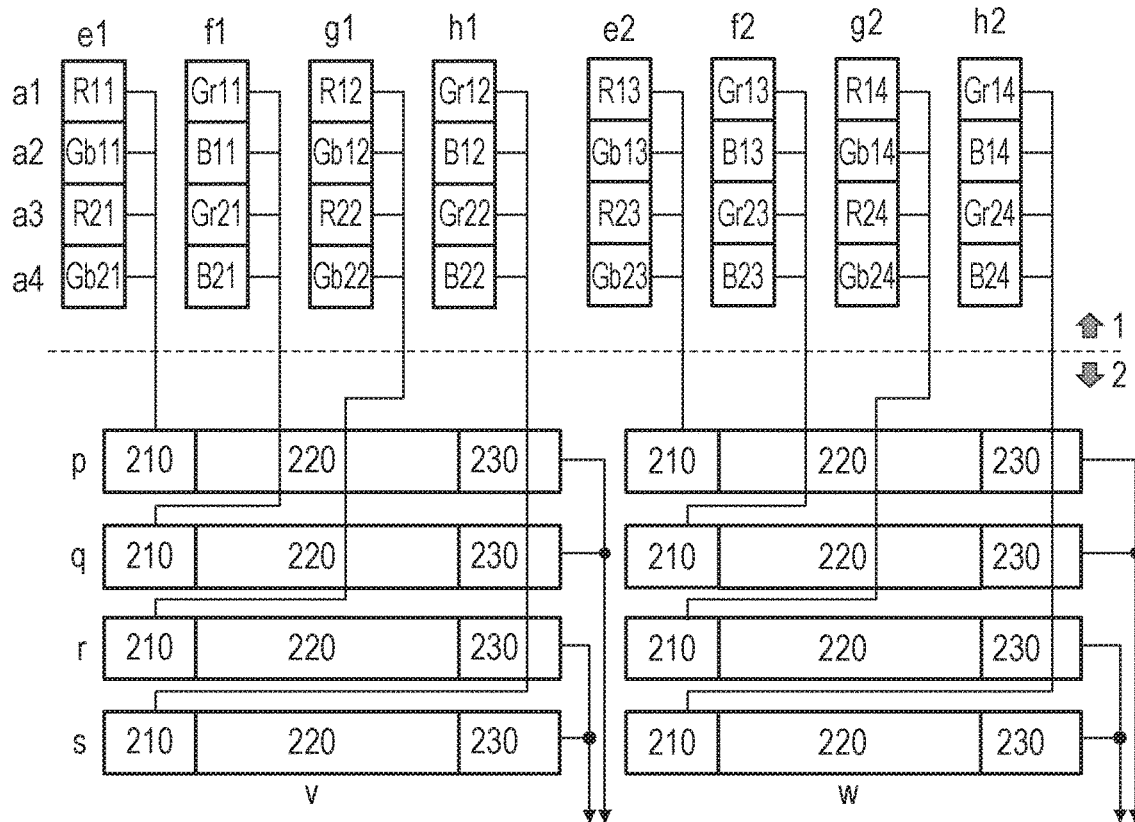
FIGS. 13A and 13B are schematic diagrams illustrating an embodiment of a semiconductor apparatus.
Figure 13B:
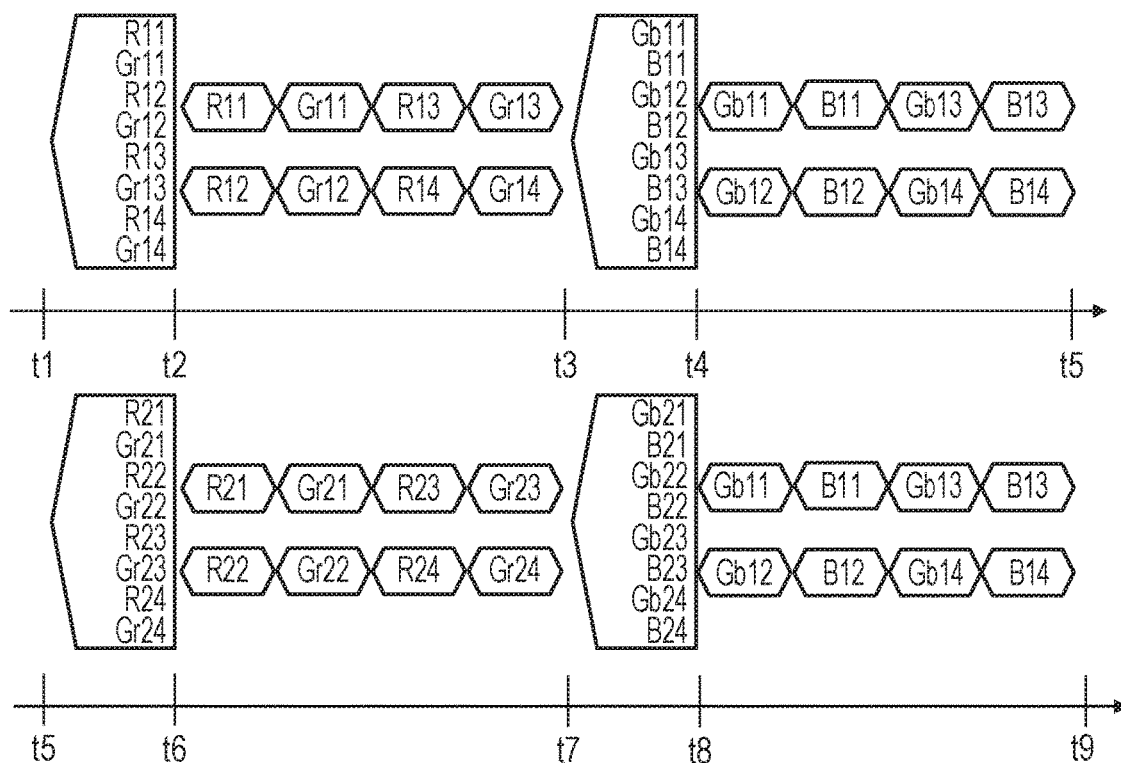

With reference to FIGS. 13A and 13B, a ninth embodiment will be described. Like numbers refer to like parts throughout, and any repetitive description will be omitted. The ninth embodiment is a variation example of the eighth embodiment. FIG. 13A illustrates a connection relationship between pixel circuit 10 and electric circuit 20, like FIG. 12A, and FIG. 13B illustrates outputs from the electric circuit 20, like FIG. 12B.

The ninth embodiment is different from the eighth embodiment in that each of the electric circuits 20 has two series of output as illustrated in FIG. 13A. Signals from the electric circuit 20 of the p-th row and the q-th row are output to different destinations from the electric circuit 20 of the r-th row and the s-th row. The electric circuits 20 of an identical row and of the v-th column and the w-th column can output signals to an identical output destination or to different output destinations though they are output to an identical output destination in this example.

FIG. 13B illustrates timing of signal processing in the electric circuit 20 and signal output from the electric circuit 20. The signal processing at the times t1 to t2 and at the times t3 to t4 is -th same as that of the eighth embodiment. At times t2 to t3, signal output from the electric circuit 20 of the p-th row and the electric circuit 20 of the r-th row of electric circuit 20 of the v-th column are performed in parallel. Next, the signal output from the electric circuits 20 of the q-th row and the signal output from the electric circuits 20 of the s-th row are performed in parallel. At the second half of times t2 to t3, of the electric circuit 20 of the w-th column, the signal output from the electric circuits 20 of the q-th row and the signal output from the electric circuits 20 of the s-th row are performed in parallel. Next, the signal output from the electric circuits 20 of the q-th row and the signal output from the electric circuits 20 of the s-th row are performed in parallel. This can reduce the time period of the time t2 to t3 for outputting signals for one row of the pixel circuits 10, compared with the eighth embodiment. As a result, high speed signal output is enabled, and imaging with a higher frame rate can be performed.

Tenth Embodiment

Figure 14A:
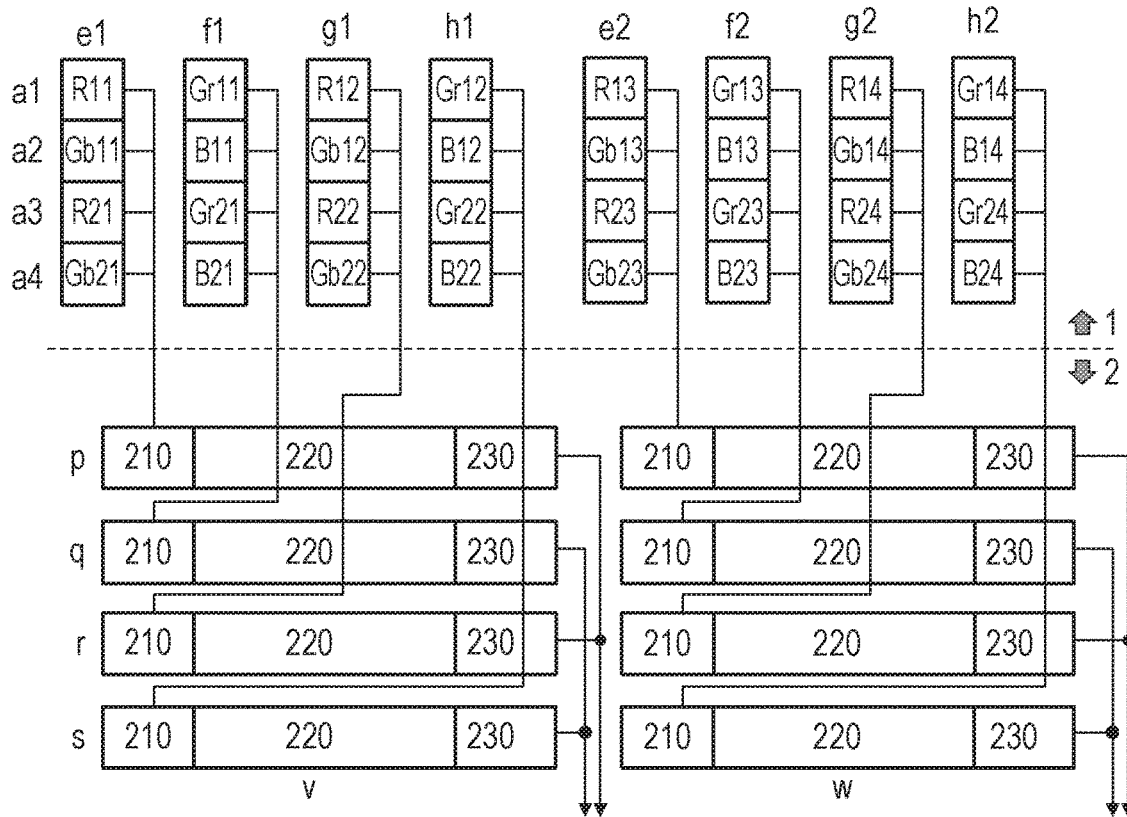
FIGS. 14A and 14B are schematic diagrams illustrating an embodiment of a semiconductor apparatus.
Figure 14B:
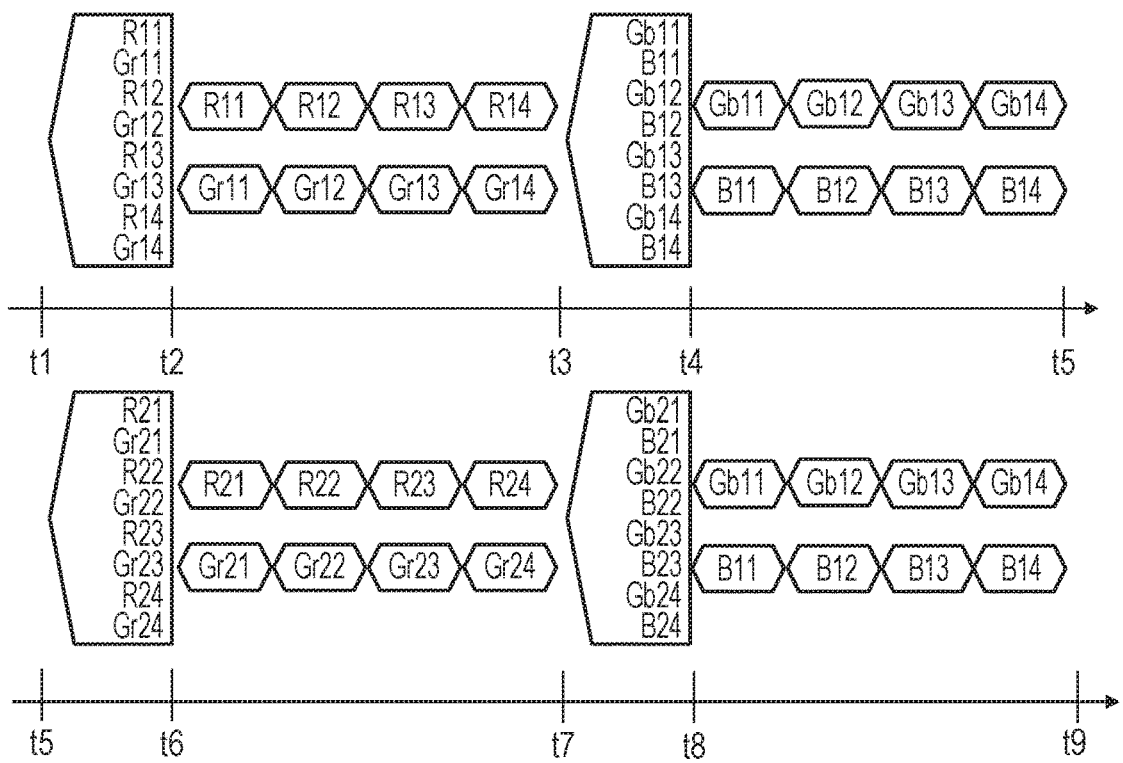

With reference to FIGS. 14A and 14B, a tenth embodiment will be described. Like numbers refer to like parts throughout, and any repetitive description will be omitted. The tenth embodiment is a variation example of the ninth embodiment. FIG. 14A illustrates a connection relationship between pixel circuit 10 and electric circuit 20, like FIG. 13A, FIG. 14B illustrates outputs from the electric circuit 20, like FIG. 13B.

The output destination from the electric circuits 20 of the p-th row is different from the output destination from the electric circuits 20 of the q-th row. The output destination from the electric circuits 20 of the r-th row is different from the output destination from the electric circuits 20 of the s-th row. The output destinations from the electric circuits 20 of the p-th and the r-th rows are identical, and output destinations from the electric circuits 20 of the q-th and s-th rows are identical. The electric circuits 20 of an identical row and of the v-th column and the w-th column can output signals to an identical output destination or to different output destinations though they are output to an identical output destination in this example.

FIG. 14B illustrates timing of signal processing in the electric circuit 20 and signal output from the electric circuit 20. The signal processing at the times t1 to t2 and at the times t3 to t4 is -th same as that of the ninth embodiment. At times t2 to t3, signal output from the electric circuit 20 of the p-th row and the electric circuit 20 of the q-th row of electric circuit 20 of the v-th column are performed in parallel. Next, the signal output from the electric circuits 20 of the r-th row and the signal output from the electric circuits 20 of the s-th row are performed in parallel. At the second half of times t2 to t3, of the electric circuit 20 of the w-th column, the signal output from the electric circuits 20 of the p-th row and the signal output from the electric circuits 20 of the q-th row are performed in parallel. Next, the signal output from the electric circuits 20 of the r-th row and the signal output from the electric circuits 20 of the s-th row are performed in parallel. As a result, high speed signal output is enabled, and imaging with a higher frame rate can be performed, like the ninth embodiment.

According to the ninth embodiment, signals of the pixel circuits 10 of any adjacent two columns are output at different times. With focus on a group of the signal R11 and the signal Gr11, they are output at different times. With focus on a group of the signal Gr11 and the signal R12, they are output at different times. On the other hand, according to the ten-th embodiment, there are a mixture of a case where signals (such as the signal R11 and the signal Gr11) of pixel circuits 10 of adjacent column are output simultaneously and a case where signals (such as a signal Gr11 and a signal R12) of pixel circuits 10 of adjacent column are output at different times. Accordingly, the pixel circuits 10 may possibly include a group of adjacent columns having a larger output difference and a group of columns having a smaller difference. When there is a relatively large cause such as a jitter which fluctuates the output about a time axis, the signal outputs may be performed as in the ninth embodiment to reduce variations in output timing between adjacent columns.

According to the tenth embodiment, with focus on two signals continuously output from an identical output series, intervals between pixel circuits 10 corresponding to any two signals are uniform. For example, signals R11, R12, R13, and R14 are all from every other rows of the pixel circuits 10. On the other hand, according to the ninth embodiment, focusing on two signals continuously output from an identical output series, intervals between pixel circuits 10 for the two corresponding signals are different. For example, the signal R11 and the signal Gr11 are signals of the pixel circuits 10 of adjacent columns, while the signal Gr11 and the signal R13 are signals of the pixel circuit 10 of two separate columns. Then, when the output series have different output properties, different output differences are produced between adjacent columns of the pixel circuits 10. In a case where output series have relatively large property difference, signals may be output as in the tenth embodiment to reduce variations in output difference between adjacent columns. In a case where data output from a semiconductor apparatus APR is to be processed, its algorithm can be optimized by processing by using adjacent pixel data. Therefore, data of neighboring pixels such as the signal Gr11 and such as the signal Gr12 according to the tenth embodiment may be continuously output rather than continuously output of data of separate pixels such as the signal Gr11 and the signal R13 according to the ninth embodiment.

Eleventh Embodiment

An eleventh embodiment is common to the first to tenth embodiments, but, among them, is preferable for the ninth embodiment or tenth embodiment.

FIG. 15 illustrates a layout of the chip 2. FIG. 15 illustrates electric circuits 20 of the p1-th row, the q1-th row, the r1-th row, the s1-th row, the p2-th row, the q2-th row, and the s2-th row. The electric circuits 20 are arranged in the v-th column, the w-th column, and the x-th column. Here, s1<q1<r1<s1<p2<q2<s2. Each of the electric circuits 20 is respectively connected to one of a plurality of pixel groups 15, schematically illustrated. According to the eleventh embodiment, the column number of the corresponding electric circuit 20 increases as the column number of the pixel group 15 increases, like the first embodiment.

According to the eleventh embodiment, in a direction of alignment of the electric circuits 20, a plurality of readout circuits 441 and 442 are provided with a plurality of rows of electric circuits 20 therebetween. The readout circuits 441 and 442 receive output signals from the electric circuits 20. The signals read out to the readout circuits 441 and 442 are transferred to the interface circuits 451 and 452, are converted to a predetermined data format by the interface circuits 451 and 452, and are output from the semiconductor apparatus. The interface circuits 451 and 452 can include an interface circuit such as a parallel-serial converter or a low voltage Differential signaling (LVDS).

The electric circuits 20 of the p1-th row, the r1-th row, the p2-th row, and the s2-th row are connected to the upper readout circuit 441. The electric circuits 20 of the q1-th row, the s1-th row, and the q2-th row are connected to the lower readout circuit 442. Thus, signals from a plurality of rows of the electric circuits 20 can be output in parallel. For example, the signal output from the electric circuit 20 of the p1-th row and the signal output from the electric circuit 20 of the q1-th row can be performed in parallel.

Twelfth Embodiment

Figure 16:
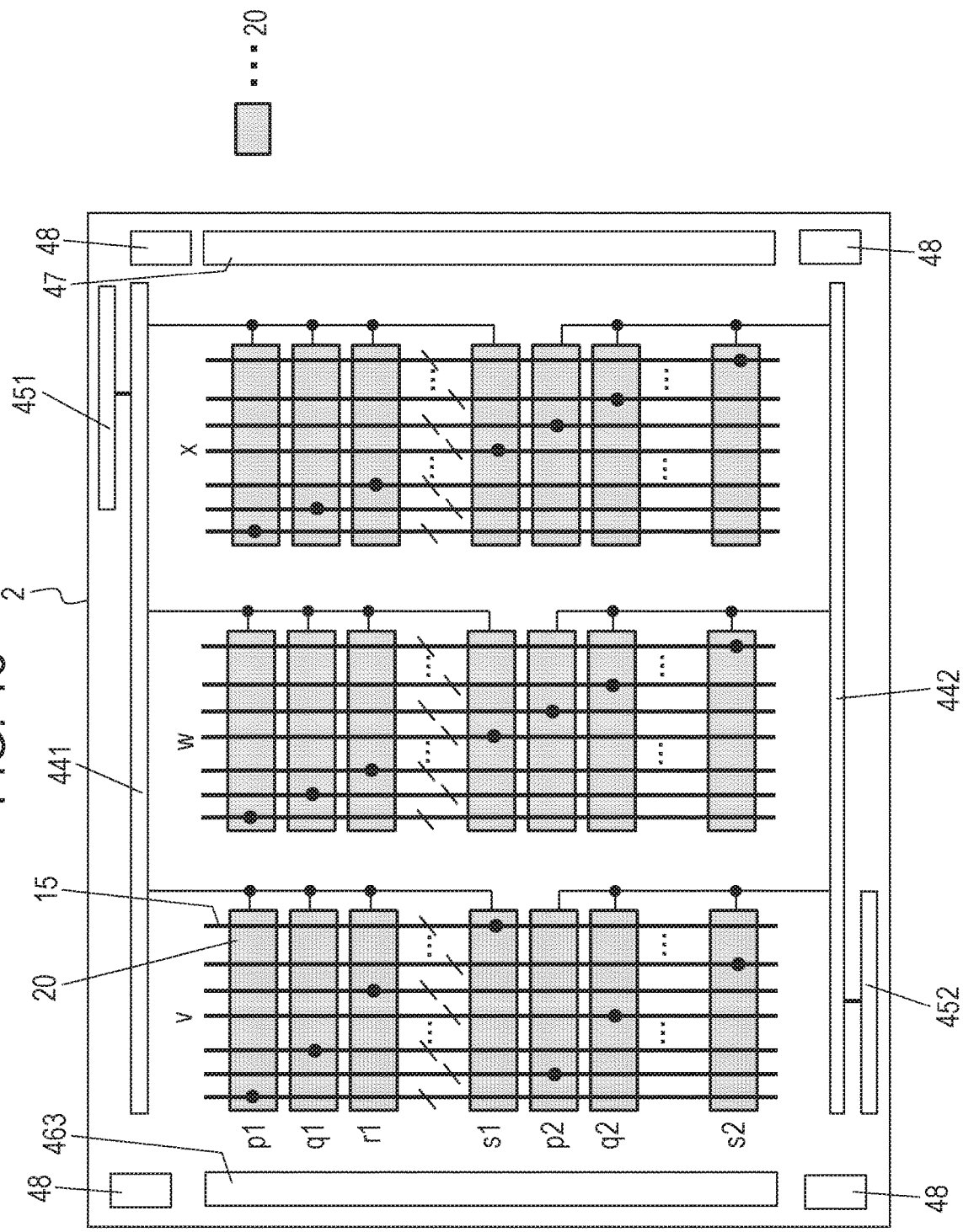
FIG. 16 is a schematic diagram illustrating an embodiment of a semiconductor apparatus.

A twelfth embodiment will be described with reference to FIG. 16. Like numbers refer to like parts throughout, and any repetitive description will be omitted. The twelfth embodiment is a variation example of the eleventh embodiment. According to the twelfth embodiment, the electric circuits 20 of the p1-th, q1-th, r1-th, s1-th rows are connected to odd numbered column pixel group 15, and the electric circuits 20 of the p2-th, q2-th, and s2-th rows are connected to even numbered column pixel group 15. For the p1-th, q1-th, r1-th, s1-th rows, as the column number (odd numbered column) of the pixel group 15 increases, the column number of the corresponding electric circuit 20 increases. For p2-th, q2-th, and s2-th rows, as the column number (even numbered column) of the pixel group 15 increases, the column number of the corresponding electric circuit 20 increases. According to this embodiment, the electric circuits 20 of the p1-th to s1-th rows are connected to the upper side readout circuit 441, and the electric circuits 20 of the p2-th to s2-th rows are connected to the low side readout circuit 442. According to the eleventh embodiment, an output line connected to the electric circuits 20 and the readout circuit 441 intersects with an output line connected to the electric circuits 20 and the readout circuit 442. On the other hand, according to the twelfth embodiment, the output line connected to the electric circuits 20 and the readout circuit 441 intersects with the output line connected to the electric circuits 20 and the readout circuit 442. This can simplify the wiring structure 22 having the output lines, can reduce the cost, and can reduce a undesirable influence for data communication such as crosstalk.

Thirteenth Embodiment

Figure 17:
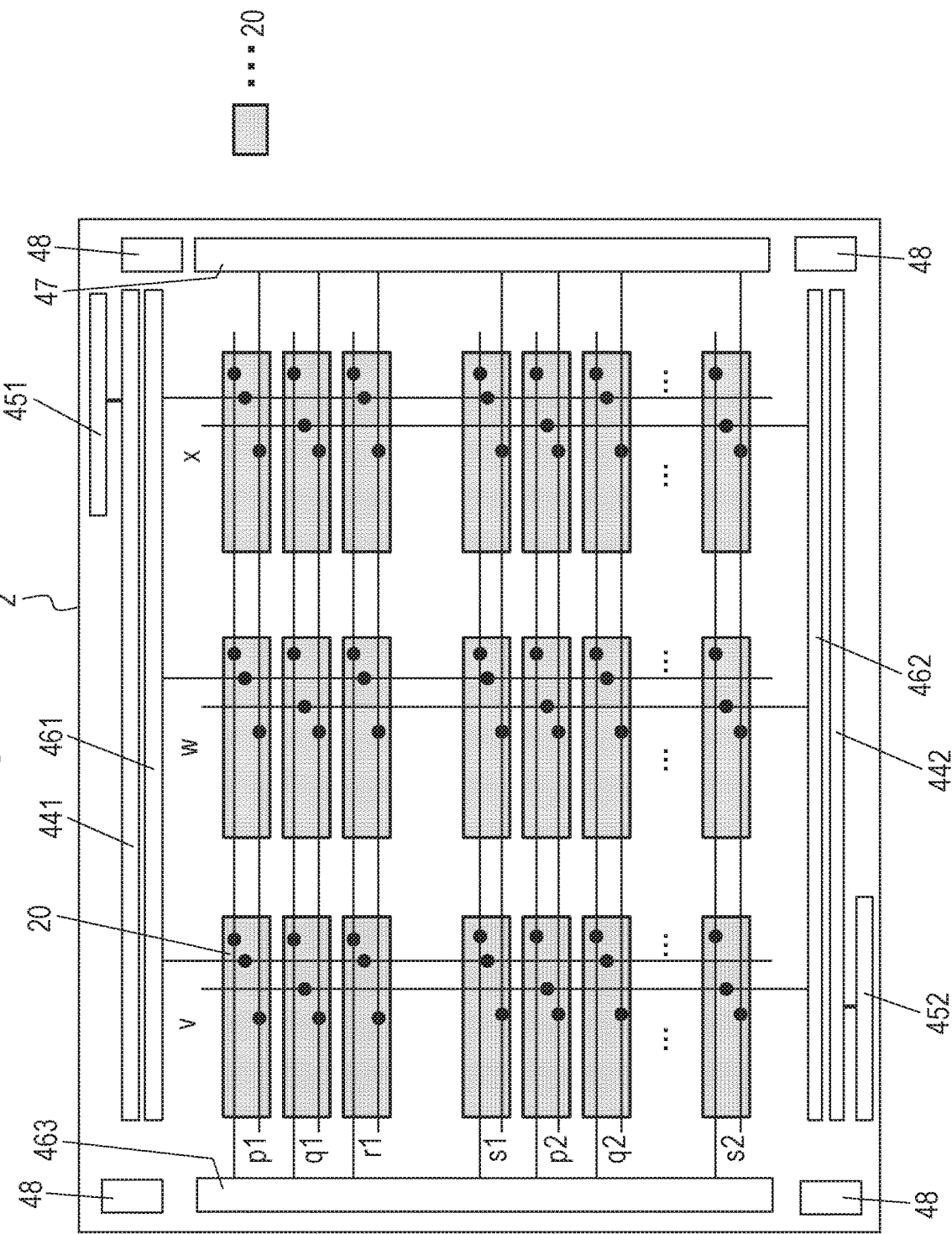
FIG. 17 is a schematic diagram illustrating an embodiment of a semiconductor apparatus.

With reference to FIG. 17, a thirteenth embodiment will be described. Like numbers refer to like parts throughout, and any repetitive description will be omitted. The thirteenth embodiment may be combined with the first to twelfth embodiments and particularly be combined with the eleventh embodiment or the twelfth embodiment. FIG. 17 illustrates a layout of the chip 2. In a direction that rows of the electric circuit 20 are aligned, a plurality of electric circuits 20 are provided between a plurality of scanning circuits 461 and 462. In the direction that columns of the electric circuits 20 align, a scanning circuit 463 is provided between a plurality of columns of the electric circuits 20 and an outside edge of the chip 2. In this example, a readout circuit 441 is placed between the scanning circuit 461 and the outside edge of the chip 2. However, the scanning circuit 461 may be placed between the readout circuit 441 and the outside edge of the chip 2. Having described that the readout circuit 442 is placed between the scanning circuit 462 and the outside edge of the chip 2, the scanning circuit 462 may be placed between the readout circuit 442 and the outside edge of the chip 2.

The scanning circuits 461 and 462 are connected to the electric circuits 20 and are configured to scan for selecting a column having an electric circuit 20 to output signal from the plurality of electric circuit 20. The scanning circuit 463 is connected to electric circuits 20 and is configured to select a row having an electric circuit 20 to output a signal from a plurality of electric circuits 20. Signals are read out from the electric circuit 20 selected by the scanning circuits 461 and 462 and scanning circuit 463 to the readout circuits 441 and 442. The scanning circuits 461 and 462, 463 may be a decoder or a shift register. In the direction that columns of the electric circuits 20 align, a drive circuit 47 is provided between a plurality of columns of electric circuit 20 and an outside edge of the chip 2. The drive circuit 47 is configured to supply power to each of a plurality of electric circuits 20 to drive the electric circuits 20.

A signal generating circuit 48 may be a part of the signal generating circuit 290 illustrated in FIG. 9, for example, and is configured to generate a synchronization signal CLK and a reference signal REF and supply them to the electric circuits 20. The signal generating circuit 48 can generate a synchronization signal and a reference signal to be supplied to an circuit other then the comparator circuit 260 in the electric circuit 20 and can supply them to the electric circuits 20.

Fourteenth Embodiment

In a case where the chip 2 has a dimension larger than 33 mm, for example, the chip 2 may be manufactured by performing light exposure in photolithography on a region divided into a plurality of exposure regions to be the chip 2 (divisional exposure). The term "dimension" here can refer to a width in a direction that columns of electric circuits 20 align. Particularly, in a case where the chip 2 is exposed by using an ArF exposure device (or possibly immersion), divisional exposure may be used. When a divisional exposure is performed, boundaries of a plurality of exposure regions may be set positions between a plurality of electric circuits 20 to prevent one electric circuit 20 from being divided. Typically, a boundary for exposure region may be defined near the center of the chip 2. A wire, described according to the eleventh to thirteenth embodiments, configured to connect the electric circuits 20, the readout circuits 441 and 442, the scanning circuits 461 and 462, 463, the drive circuit 47, and the signal generating circuit 48 is a global wire that is longer in the chip 2. In order to connect photo resist patterns for global wiring in divisional exposure, stitching exposure may be performed. Because the global wiring is driven with a low impedance, performing stitching exposure has a small influence on the output property. Because the interface circuits 451 and 452 operate at a higher frequency than the global wiring, the global wiring may not be connected to the interface circuits 451 and 452 through stitching exposure. Accordingly, as illustrated in FIGS. 15 to 17, the interface circuits 451 and 452 may advantageously be separately from the center having the boundary of the exposure region. For example, the interface circuits 451 and 452 may not be placed in the direction where the columns of electric circuits 20 aligned between the electric circuits 20 of the U/2 column of the electric circuit 20 of the U column and the outside edge of the chip 2 where U is an even number. The interface circuits 451 and 452 in the direction that columns of electric circuit 20 align may not be placed between a (U+1)/2 column of electric circuits 20 and an outside edge of the chip 2 where U is an odd number. In the example in FIGS. 15 and 16, U is 3. In the direction that columns of electric circuits 20 align, the w-th column corresponding to the second column and the outside edge of the chip 2 do not have the interface circuits 451 and 452. The interface circuits 451 and 452 are placed between the v-th column or the x-th column and the outside edge of the chip 2.

Fifteenth Embodiment

Figure 18:
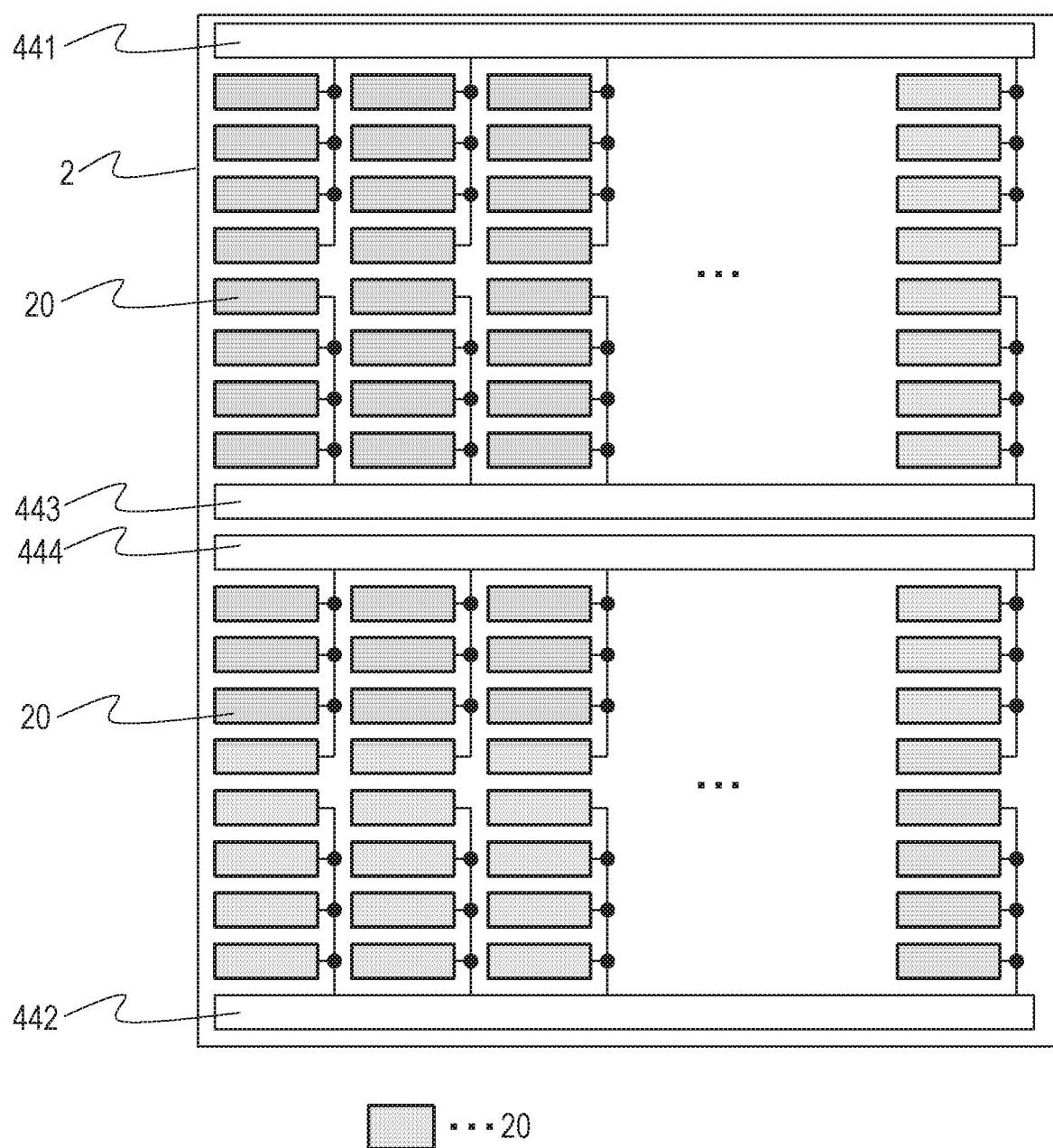
FIG. 18 is a schematic diagram illustrating an embodiment of a semiconductor apparatus.

With reference to FIG. 18, a thirteenth embodiment will be described. Like numbers refer to like parts throughout, and any repetitive description will be omitted. FIG. 18 illustrates a layout of a circuit of the chip 2, like FIGS. 15 and 16.

According to the fifteenth embodiment, the readout circuits 443 and 444 are placed between a part of the electric circuits 20 arranged in a matrix form and a part of the electric circuits 20 arranged in a matrix form. Thus, a more amount of data can be output simultaneously. For example, data of pixels of a first color can be read out from the readout circuit 441, data of pixels of a second color can be read out from the readout circuit 442, data of pixels of a fourth color can be read out from the 443 and 444. Alternatively, data of pixels of a first color can be read out from the readout circuit 441 and the readout circuit 442, data of pixels of a second color can be read out from the readout circuit 443, data of pixels of a third color can be read out from the 444.

Figure 19A:
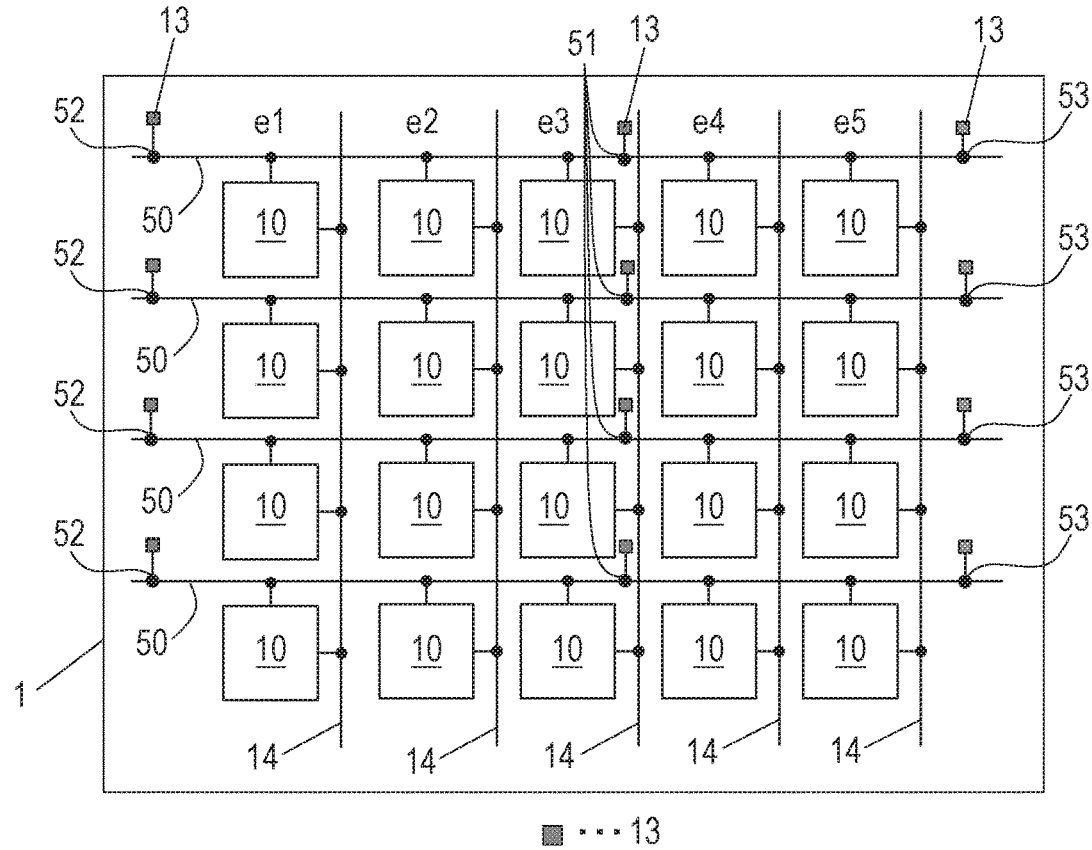
FIGS. 19A and 19B are schematic diagrams illustrating an embodiment of a semiconductor apparatus.

Sixteenth Embodiment with reference to FIGS. 19A and 19B, a sixteenth embodiment will be described. Like numbers refer to like parts throughout, and any repetitive description will be omitted. FIG. 19A illustrates a plane layout of a chip 1 a plurality of pixel circuits 10 of each row are connected to a common scanning wire 50. Each of the scanning wires 50 commonly supplies transfer signal TX such as signal PTX according to the seventh embodiment, a selection signal SEL such as a signal PSEL, a reset signal RES such as a signal PRES to a plurality of pixel circuit 10 of an identical row. The transfer signal TX, the selection signal SEL, and the reset signal RES will be collectively called scanning signals.

Figure 19B:
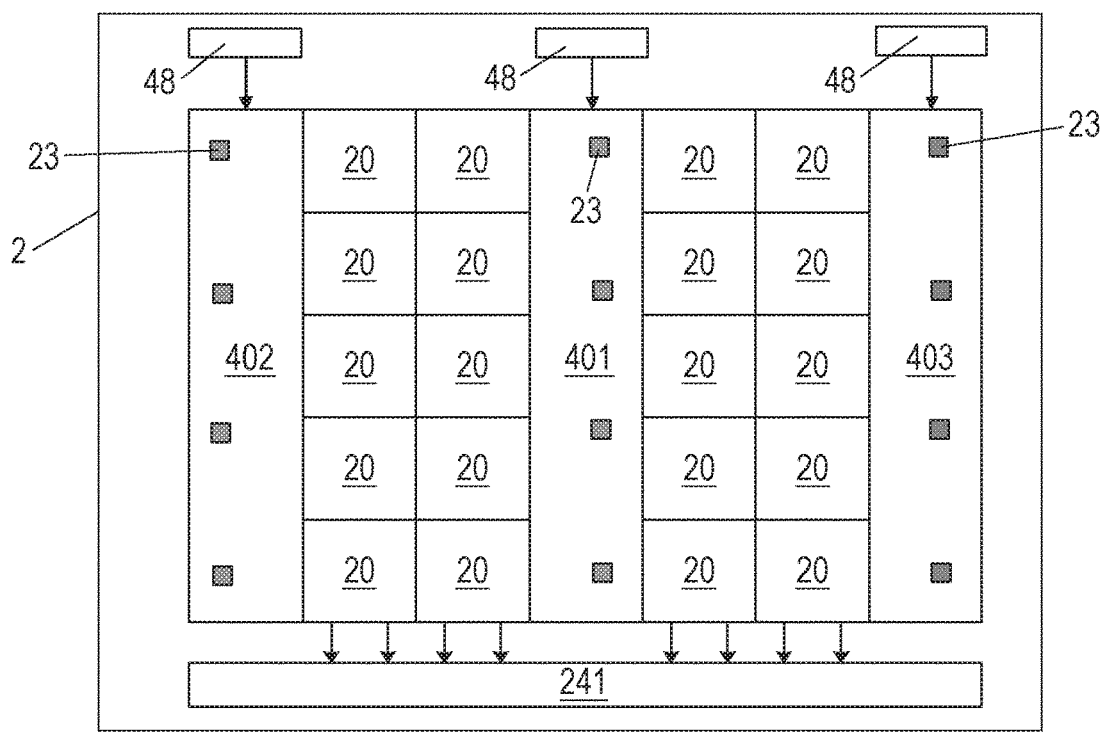

FIG. 19B is a plane layout of a chip 2. The chip 2 has scanning circuits 401, 402, and 403. The scanning circuit 401 is placed between a plurality of electric circuits 20 in the direction that columns of electric circuits 20 align. The scanning circuits 402 and 403 are placed between a plurality of electric circuits 20 and an outside edge of the chip 2 in the direction that columns of electric circuits 20 align. At least one of the scanning circuits 401, 402, and 403 may be provided in the chip 2. It should be noted that one of the scanning circuits 401, 402, and 403 can be provided in the chip 1 instead of the chip 2.

The scanning circuits 401, 402, and 403 are connected to conductors 23, and the scanning wires 50 connected to conductors 13. The scanning circuits 401, 402, 403 are connected to the scanning wires 50 via the conductors 23, 13 and supply the scanning signals to the scanning wires 50.

The pixel circuits 10 of the e1-th to e5-th columns are connected to the scanning wires 50. Each of the scanning wires 50 has a center part 51, one end part 52, and the other end part 53. A plurality of pixel circuits 10 are connected across the center part 51. For example, the part 51 is positioned between a part where pixel circuits 10 of the e2-th column are connected to the scanning wire 50 and a part where the pixel circuits 10 of the e4-th column are connected to the scanning wire 50. Alternatively, the part 51 is positioned between a part where the pixel circuits 10 of the e1-th column are connected to the scanning wire 50 and the part where the pixel circuits 10 of the e5-th column are connected to the scanning wire 50. All pixel circuits 10 of an identical row is connected to a part between one end part 52 of the scanning wire 50 and the other end part 53. In other words, the pixel circuit 10 is not connected to the opposite side of the part 53 about the part 52 of the scanning wire 50, and the pixel circuit 10 is not connected to the opposite side of the part 52 about the part 53 of the scanning wire 50.

A wire (including conductors 13 and 23) from a scanning circuit 401 is connected to the center part 51. Within the scanning wire 50, the scanning circuit 401 is connected to the part 51 between two columns of the pixel circuits 10. Thus, from the part 51, a scanning signal is supplied to pixel circuits 10 of the e1-th and e2-th column positioned on one side of the part 51 and to pixel circuits 10 of the e4th, e5-th columns positioned on the other side of the part 51. This can reduce the distance from the part receiving a scanning signal of the scanning wire 50 to the farthest pixel circuit 10, compared with a case where a scanning signal is supplied to only one of one end part 52 and the other end part 53 of the scanning wire 50. Therefore, the delay of the scanning signal in the farthest pixel circuit 10 can be reduced, and the scanning signal can be read out at a high speed from the pixel circuit 10. Accordingly, the delays can be reduced for selecting, processing, and outputting signals in parallel in a plurality of electric circuits 20, for improved performance of the electric circuits 20.

According to this embodiment, the scanning circuit 402 is connected to the parts 52 via conductors 13 and 23 so that scanning signals in synchronization with the scanning circuit 401 can be supplied from the scanning circuit 402 to the scanning wires 50. The scanning circuit 403 is connected to the parts 53 via the conductors 13 and 23 so that scanning signals in synchronization with the scanning circuit 401 can be supplied to the scanning wires 50 also from the scanning circuit 403. In this case, quicker read operations can be performed on the pixel circuits 10. It should be noted that scanning signals can be supplied from the scanning circuit 402 and scanning circuit 403 to the parts 52 and 53, by omitting the scanning circuit 401. Alternatively, scanning signals can be supplied from the scanning circuit 402 and/or scanning circuit 403 to the part 51 by omitting the scanning circuit 401. However, the scanning circuit 401 may be connected to the parts 51 for improvement against delays of scanning signals.

Seventeenth Embodiment

With reference to FIGS. 20A to 20D, a seventeenth embodiment will be described. The seventeenth embodiment includes an example and a variation example of the sixteenth embodiment. Any repetitive descriptions regarding this embodiment and the other embodiment, particularly, sixteenth embodiment will be omitted.

Figure 20A:
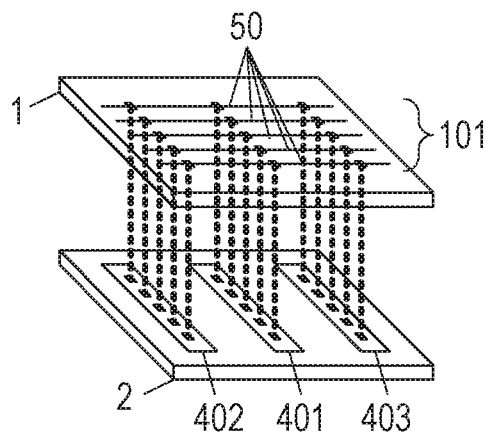
FIGS. 20A to 20D are schematic diagrams illustrating an embodiment of a semiconductor apparatus.

FIG. 20A illustrates a first example corresponding to a perspective view of the seventeenth embodiment.

Figure 20B:
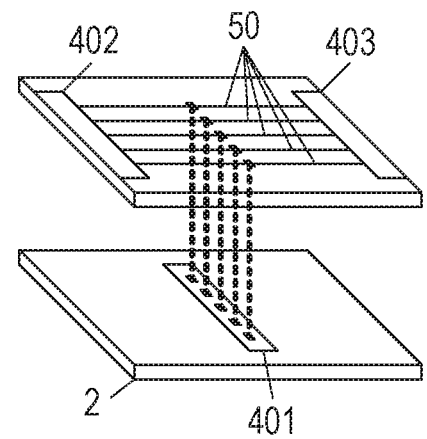

FIG. 20B illustrates a second example in which the scanning circuit 401 is connected to a center part (corresponding to the part 51) of the scanning wires 50 by omitting the scanning circuits 402 and 403.

Figure 20C:
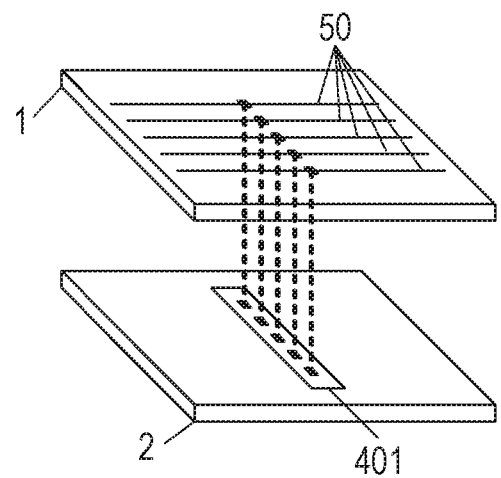

FIG. 20C illustrates a third example having scanning circuits 402, 403 in a chip 1. In the direction that columns of the pixel circuits 10 align, a plurality of pixel circuits 10 is positioned between the scanning circuit 402 and the scanning circuit 403. In other words, in the direction that columns of the pixel circuits 10 align, the scanning circuits 402, 403 are positioned between a plurality of pixel circuits 10 and an outside edge of the chip 1. This can reduce the distance between the scanning circuit 402, 403 and the scanning wires 50 in the chip 1 and thus can increase the speed for driving the pixel circuits 10.

Figure 20D:
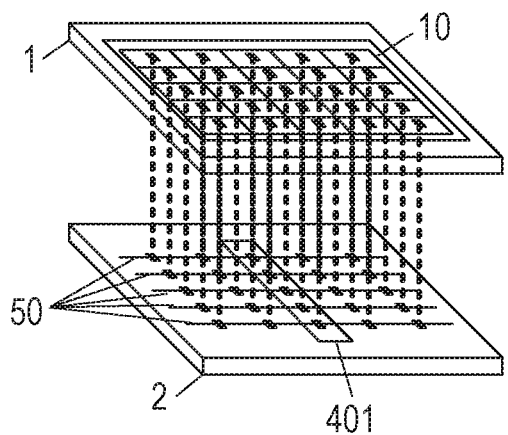

FIG. 20D illustrates a fourth example in which the scanning wires 50 are placed in a chip 2 instead of the chip 1. In other words, the scanning wires 50 are global wiring having a wiring layer included in a wiring structure 22 of the chip 2. A center part (corresponding to the part 51) of the scanning wires 50 provided in the chip 2 is connected to a plurality of pixel circuits 10 via conductors 13 and 23 (not illustrated). This configuration may require conductors 13 and 14 the numbers of which are equal to several times of the number of pixel circuits 10 (depending on the number of types of scanning signal). This may possibly lead to complexity of the semiconductor apparatus APR and may possibly increase its cost. Therefore, the scanning wires 50 may advantageously be provided in the wiring structure 12 of the chip 1.

Eighteenth Embodiment

Figure 21A:
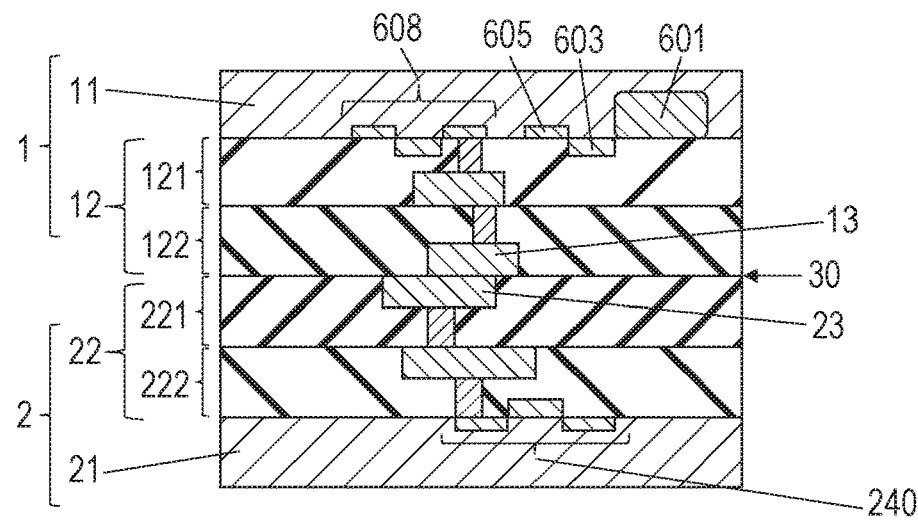
FIGS. 21A to 21C are schematic diagrams illustrating an embodiment of a semiconductor apparatus.
Figure 21B:
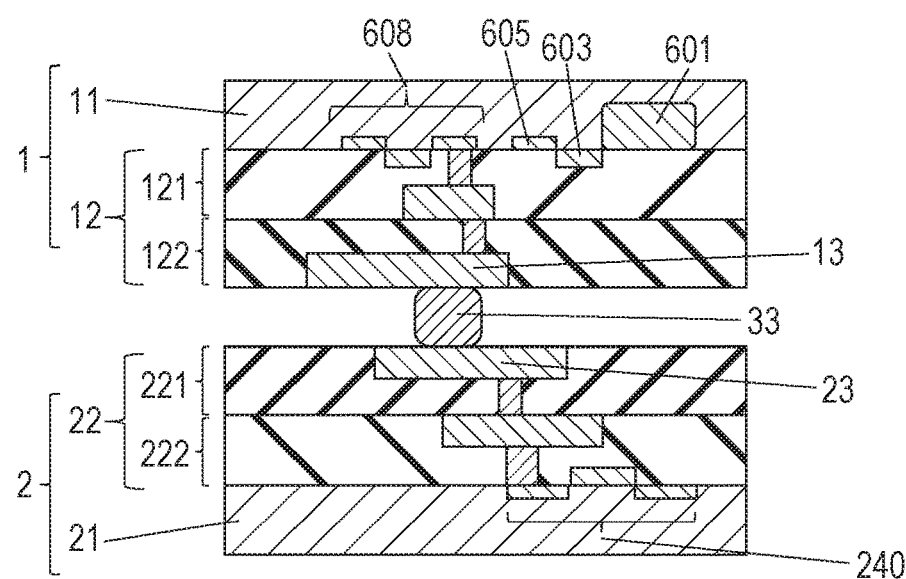
Figure 21C:
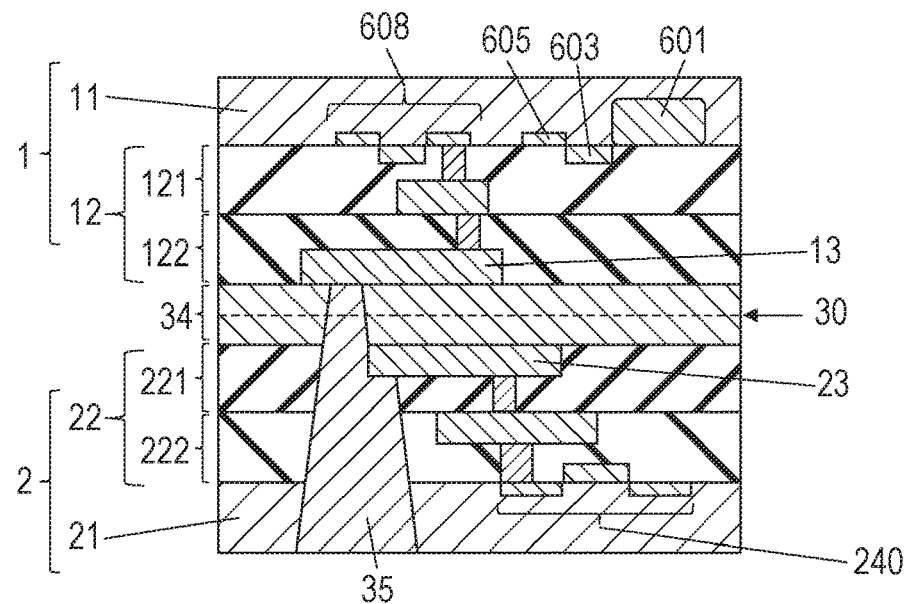

With reference to FIGS. 21A to 21C, an eighteenth embodiment will be described. Like numbers refer to like parts throughout, and any repetitive description will be omitted. The eighteenth embodiment has a common configuration to those of the first to seventeen embodiments. The eighteenth embodiment relates to a connection between the conductor 13 and the conductor 23.

FIG. 21A illustrates a cross-sectional view of a semiconductor apparatus IC. Between the semiconductor layer 11 of the chip 1 and the semiconductor layer 21 of the chip 2, a wiring structure 12 of the chip 1 and a wiring structure 22 of the chip 2 are positioned. The wiring structure 12 has M wiring layers 121, 122. The wiring layers 121, 122 can be Cu wiring layers. In this example, the wiring layer 122 includes the conductor 13. The conductor 13 is embedded in a recess of an interlayer insulating film and has a damascene structure (or a dual damascene structure in this embodiment). The wiring structure 22 has N wiring layers 221, 222. The number (N) of the wiring layers of the wiring structure 22 may be higher than the number (M) of wiring layers of the wiring structure 12 (M>N). Thus, the performance of the pixel circuits 10 and the electric circuits 20 can be increased, and, at the same time, the cost of the semiconductor apparatus APR can be reduced. The wiring layers 221 and 222 can be Cu wiring layers. In this example, the wiring layer 222 includes the conductor 23. The conductor 23 is embedded in a recess of an interlayer insulating film and has a damascene structure (or a dual damascene structure in this embodiment). The conductor 13 and the conductor 23 are bonded. The interlayer insulating film having the recess having the conductor 13 embedded therein is also bonded (or in contact with) the interlayer insulating film having the recess having the conductor 23 embedded therein. Due to a displacement or differences in dimension of the conductor 13 and the conductor 23, the conductor 13 may face the interlayer insulating film having the recess having the conductor 23 embedded therein. The conductor 23 faces the interlayer insulating film having the recess having the conductor 13 embedded therein. A bonded surface 30 is a contact surface between the conductors 13 and 23 and the interlayer insulating films. According to this example, the conductors 13 and 23 having a smaller dimensions can increase the number of connecting units for the pixel circuits 10 and electric circuits 20 so that more pixel circuits 10 can be processed in parallel by the plurality of electric circuits 20.

In the semiconductor layer 11, a photoelectric conversion element 601 and an electric charge detection unit 605 are provided through a transfer transistor 603. The chip 1 has a back side irradiation light receiving structure. The conductor 13 is connected to a semiconductor element of the pixel circuit 10 via the wiring layer 121. The semiconductor element of the pixel circuit 10 to which the conductor 13 is to be connected may be a transistor, for example, but may be a diode, a resistor, or a capacitor. In this embodiment, the conductor 13 is connected to a selection transistor 608. In the semiconductor layer 11, the photoelectric conversion element 601 and the electric charge detection unit 605 are provided through the transfer transistor 603. The conductor 23 is connected to the semiconductor element in the electric circuit 20 through the wiring layer 221. The semiconductor element of the electric circuit 20 to which the conductor 23 is to be connected may be a transistor, for example, but may be a diode, a resistor, or a capacitor. In this embodiment, the conductor 23 is connected to a selection circuit 240. The transistor contained in the electric circuit 20 may have a silicide layer of cobalt silicide or nickel silicide, for example. A gate electrode such as a metal gate may be provided, and a gate insulating film such as a high-k insulating film may be provided. A transistor to be used in the electric circuit 20 may be a planer-type MOSFET or an Fin-FET. The gate insulating film of the transistor provided in the semiconductor layer 21 may have a plurality of types of thickness. A transistor having a thick gate insulating film may be used in a circuit desirably having a high-withstand voltage such as a power supply system or an analog system. A transistor having a thick gate insulating film may be used in a circuit desirably having a high speed characteristic such as a digital system. The semiconductor layer 11 may be approximately 1 to 10 µm thick, and the semiconductor layer 21 may be equal to that of the semiconductor layer 11 or may be thicker than the semiconductor layer 11. The semiconductor layer 11 may be 50 to 800 µm thick, for example.

FIG. 21B illustrates a cross sectional view of a semiconductor apparatus APR. The example illustrated in FIG. 21B is different from the example in FIG. 21A in that the conductor 13 and the conductor 23 are not in contact. The conductor 13 and the interlayer insulating film having the recess having the conductor 23 embedded therein. The interlayer insulating film having the recess having the conductor 13 embedded therein is separated from the interlayer insulating film having the recess having the conductor 23 embedded therein. A bump 33 is provided between the conductor 13 and the conductor 23. The bump 33 may require a size of approximately several or several tens up. However, according to the first to eighteenth embodiments, because the number of electric circuits 20 can be lower than the number of pixel circuits 10, a predetermined level of performance can be achieved even with use of the bump 33.

FIG. 21C illustrates a cross sectional view of a semiconductor apparatus (APR). The example illustrated in FIG. 21B is different from the example in FIG. 21A in that the conductor 13 and the conductor 23 are not in contact. An adhesive layer 34 is provided between a wiring structure 12 and a wiring structure 22 and is configured to adhere interlayer insulating films of the wiring structure 12 and wiring structure 22. The adhesive layer 34 has a bonded surface 30 is a contact surface between the adhesive layer of the wiring structure 12 and the adhesive layer of the wiring structure 22. The conductor 13 and the conductor 23 are connected through a penetrate electrode 35 configured to penetrate the semiconductor layer 21. In this example, the penetrate electrode is provided in the semiconductor layer 21 instead of the semiconductor layer 11. Therefore, the penetrate electrode 35 does not prevent integration of the pixel circuit 10 and can suppress damages on the semiconductor layer 11. However, because the penetrate electrode 35 may possibly prevent integration of the electric circuit 20, the example in FIG. 21A is desirably applied.

Nineteenth Embodiment

According to a nineteenth embodiment, an equipment (EQP) illustrated in FIG. 1A will be described in detail. The semiconductor apparatus APR can include a package (PKG) configured to accommodate a semiconductor apparatus IC as well as a semiconductor apparatus IC that is a laminated member of the chips 1 and 2. The package PKG can include a base member having a semiconductor apparatus or integrated circuit (IC) fixed thereon, lid body of glass facing the a semiconductor apparatus IC, and a connection member such as a bonding wire or a bump configured to connect a terminal provided on the base member and a terminal provided in the semiconductor apparatus IC.

The equipment EQP can further include at least one of an optical system (OPT), a control apparatus (CTRL), a processing apparatus (PRCS), display apparatus (DSPL), and memory apparatus (MMRY). The optical system OPT is configured to be focused on the semiconductor apparatus APR as a photoelectric conversion apparatus, such as a lens, a shutter, and a mirror. The control apparatus CTRL is configured to control the semiconductor apparatus APR, such as a semiconductor apparatus such as an application-specific integrated circuit (ASIC). The processing apparatus PRCS is configured to process a signal output from the semiconductor apparatus APR and may be a semiconductor apparatus such as a central processing unit (CPU) or an ASIC for configuring an analog front end (AFE) or digital front end (DFE). The display apparatus DSPL is configured to display information (image) acquired by the semiconductor apparatus APR and is an electroluminescent (EL) display apparatus or a liquid crystal display apparatus. The memory apparatus MMRY is a magnetic apparatus or a semiconductor apparatus configured to store information (image) acquired by the semiconductor apparatus APR. The memory apparatus MMRY may be a volatile memory such as a static random access memory (SRAM) or a dynamic random access memory (DRAM) or a nonvolatile memory such as a flash memory or a hard disk drive. A machine apparatus (MCHN) has a movable part or driving part such as a motor or an engine. In the equipment EQP, a signal output from the semiconductor apparatus APR may be displayed on the display apparatus DSPL or may be transmitted externally through a communication apparatus (not illustrated) included in the equipment EQP. Accordingly, the equipment EQP may further include a memory apparatus MMRY and a processing apparatus PRCS in addition to a storage control unit and an arithmetic operation control unit included in the semiconductor apparatus APR.

The equipment EQP illustrated in FIG. 1A can be an electronic equipment such as an information terminal (such as a smart phone and a wearable terminal) having an imaging function, a camera (such as a lens replacement camera, a compact camera, a video camera, and a monitor camera). The machine apparatus MCHN with a camera can drive an optical system OPT parts for zooming, focusing, and shutter operations. The equipment EQP can be a transport apparatus (moving body) such as a vehicle, a ship, or an airplane. The machine apparatus MCHN in a transport apparatus can be used as a movement apparatus. The equipment EQP being a transport apparatus may be configured to transport a semiconductor apparatus APR aid and/or automate driving (steering) by an imaging function. The processing apparatus PRCS configured to aid and/or automate driving (steering) can perform processing for operating the machine apparatus MCHN being a moving apparatus based on information acquired by the semiconductor apparatus APR.

A semiconductor apparatus APR according to the aforementioned embodiments can provide high value to designers, manufactures, sellers, purchasers and/or users. Installing a semiconductor apparatus APR in the equipment EQP can improve the value of the equipment EQP. Therefore, determination of installation of a semiconductor apparatus APR in the equipment EQP according to this embodiment in manufacturing or selling the equipment EQP can advantageously increase the value of the equipment EQP.

The aforementioned embodiments can be changed, altered or modified as required without departing from the spirit and scope of the present disclosure. The disclosure of the embodiments can include not only details specified herein but also all matters grasped from the Description and the appended drawings. Components with the same names but with different references can be distinguished as a first component, a second component, a third component and so on.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-192050 filed Sep. 29, 2017, which is hereby incorporated by reference herein in its entirety.

What is claimed is:

1. A semiconductor apparatus comprising a stack of a first chip having a plurality of pixel circuits arranged in a matrix form of J rows and K columns and a second chip having a plurality of electric circuits arranged in a matrix form of T rows and U columns,
wherein each of the plurality of electric circuits has a first part and a second part, and the first part is connected to at least two pixel circuits of the plurality of pixel circuits and the second part, and the first part is configured to sequentially select a pixel circuit from the two pixel circuits to connect to the second part,
wherein the a1-th row and the e1-th column pixel circuit of the plurality of pixel circuits are connected to the electric circuit of the p-th row and the v-th column of the plurality of electric circuits,
wherein the a2-th row and the f1-th column pixel circuit of the plurality of pixel circuits is connected to the electric circuit of the q-th row and the v-th column of the plurality of electric circuits,
wherein the pixel circuit of the a3-th row and the g1-th column of the plurality of pixel circuits is connected to the electric circuit of the r-th row and the v-th column of the plurality of electric circuits,
wherein the pixel circuit of the a4-th row and the h1-th column of the plurality of pixel circuits is connected to the electric circuit of the s-th row and the v-th column of the plurality of electric circuits, and
$T<J$ and $U<K$, f1 and g1 are integers between e1 and h1, and q and r are integers between p and s.

2. The semiconductor apparatus according to claim 1,
wherein the pixel circuit of the b1-th row and the e1-th column of the plurality of pixel circuits is connected to the electric circuit of the p-th row and the v-th column,
wherein the pixel circuit of the b2-th row and the f1-th column of the plurality of pixel circuits is connected to the electric circuit of the q-th row and the v-th column,
wherein the pixel circuit of the b3-th row and the g1-th column of the plurality of pixel circuits is connected to the electric circuit of the r-th row and the v-th column, and
the pixel circuit of the b4-th row and the h1-th column of the plurality of pixel circuits are connected to the electric circuit of the s-th row and the v-th column.

3. The semiconductor apparatus according to claim 1,
wherein the pixel circuit of the b1-th row and the e2-th column of the plurality of pixel circuits is connected to the electric circuit of the p-th row and the w-th column of the plurality of electric circuits,
wherein the pixel circuit of the b2-th row and the f2-th column of the plurality of pixel circuits is connected to the electric circuit of the q-th row and the w-th column of the plurality of electric circuits,
wherein the pixel circuit of the b3-th row and the g2-th column of the plurality of pixel circuits is connected to the electric circuit of the r-th row and the w-th column of the plurality of electric circuits,
the pixel circuit of the b4-th row and the h2-th column of the plurality of pixel circuits are connected to the electric circuit of the s-th row and the w-th column of the plurality of electric circuits.

4. The semiconductor apparatus according to claim 3,
wherein the pixel circuit of the a1-th row and the e2-th column of the plurality of pixel circuits is connected to the electric circuit of the p-th row and the w-th column,
wherein the pixel circuit of the a2-th row and the f2-th column of the plurality of pixel circuits is connected to the electric circuit of the q-th row and the w-th column,
wherein the pixel circuit of the a3-th row and the g2-th column of the plurality of pixel circuits is connected to the electric circuit of the r-th row and the w-th column, and
wherein the pixel circuit of the a4-th row and the h2-th column of the plurality of pixel circuits is connected to the electric circuit of the s-th row and the w-th column.

5. The semiconductor apparatus according to claim 3, wherein f2 and g2 are integers between e2 and h2.

6. The semiconductor apparatus according to claim 1, wherein $e1<f1<g1<h1$ and $p<q<r<s$.

7. The semiconductor apparatus according to claim 1, wherein $J \leq T \times U < J \times K/2$.

8. The semiconductor apparatus according to claim 3, wherein a first output for outputting a signal based on a signal generated by the pixel circuit of the a1-th row and the e1-th column from one of the plurality of electric circuits, a second output for outputting a signal based on a signal generated by the pixel circuit of the a1-th row and the e2-th column from one of the plurality of electric circuits, and a third output for outputting a signal based on a signal generated by the pixel circuit of the a2-th row and the e1-th column from one of the plurality of electric circuits are performed in this order.

9. The semiconductor apparatus according to claim 8, wherein, in parallel with the first output, a signal based on a signal generated by the pixel circuit of the a1-th row and the f1-th column from one of the plurality of electric circuits.

10. The semiconductor apparatus according to claim 1, wherein, in a direction of alignment of rows of the plurality of electric circuits, a first readout circuit is placed between the plurality of electric circuits and a first side of the second chip and receives signals output from two or more electric circuits of the plurality of electric circuits, and
wherein, in the direction of alignment of rows of the plurality of electric circuits, a second readout circuit is placed between the plurality of electric circuits and a second side of the second chip and receives signals output from two or more electric circuits of the plurality of electric circuits.

11. The semiconductor apparatus according to claim 1, wherein the second chip has a width larger than 33 mm in a direction having an alignment of columns of the plurality of electric circuits, and the second chip has an interface circuit,
wherein U is an even number, and the interface circuit is not placed between an electric circuit of the U/2-th column of the plurality of electric circuits and an outside edge of the first chip, or
wherein U is an odd number, and the interface circuit is not placed between an electric circuit of the (U+1)/2-th column of the plurality of electric circuits and an outside edge of the second chip.

12. The semiconductor apparatus according to claim 1, wherein the second part of each of the plurality of electric circuits includes an analog-digital converter.

13. The semiconductor apparatus according to claim 12, wherein the analog-digital converter is a successive approximation register analog-digital converter.

14. An equipment comprising the semiconductor apparatus according to claim 1 and further comprising at least some of:
an optical system configured to be focused on the semiconductor apparatus, a control apparatus configured to control the semiconductor apparatus, a processing apparatus configured to process a signal output from the semiconductor apparatus, a machine apparatus configured to be controlled based on information obtained by the semiconductor apparatus, a display apparatus configured to display the information obtained by the semiconductor apparatus, and a memory apparatus configured to store the information obtained by the semiconductor apparatus.

15. The semiconductor apparatus according to claim 2, wherein the pixel circuit of the a1-th row and the e1-th column is a first pixel circuit,
wherein the pixel circuit of the b1-th row and the e1-th column is a second pixel circuit,
the pixel circuit of the a2-th row and the e1-th column is a third pixel circuit,
wherein the pixel circuit of the b2-th row and the e1-th column is a four-th pixel circuit,
the first pixel circuit and the second pixel circuit are connectable to the electric circuit of the p-th row and the v-th column through a first signal line, and
wherein the third pixel circuit and the four-th pixel circuit are connectable to the electric circuit of the p-th row and the v-th column through a second signal line different from the first signal line.

16. The semiconductor apparatus according to claim 15, wherein the first part of the electric circuit of the p-th row and the v-th column is configured to be capable of switching between a connection between the first signal line and the second part of the electric circuit of the p-th row and the v-th column and a connection between the second signal line and the second part of the electric circuit of the p-th row and the v-th column.

17. The semiconductor apparatus according to claim 16, wherein each of the plurality of electric circuits has an amplification transistor and a selection transistor, wherein the amplification transistor of the first pixel circuit is connectable to the first signal line through the selection transistor of the first pixel circuit, wherein the amplification transistor of the second pixel circuit is connectable to the first signal line through the selection transistor of the second pixel circuit.

18. The semiconductor apparatus according to claim 1, wherein the first part of each of the plurality of electric circuits includes a multiplexer.

19. The semiconductor apparatus according to claim 18, wherein each of the plurality of electric circuits has a third part connected to the second part, and wherein the third part includes a sensing amplifier.

20. A semiconductor apparatus comprising a stack of a first chip having a plurality of pixel circuits arranged in a matrix form of J rows and K columns and a second chip having a plurality of electric circuits arranged in a matrix form of T rows and U columns,
wherein each of the plurality of electric circuits processes signals generated by the plurality of pixel circuits,
the pixel circuit of the a-th row and the e1-th column of the plurality of pixel circuits is connected to the electric circuit of the p-th row and the v-th column of the plurality of electric circuits,
wherein the pixel circuit of the a-th row and the f1-th column of the plurality of pixel circuits is connected to the electric circuit of the q-th row and the v-th column of the plurality of electric circuits, and
wherein the pixel circuit of the a-th row and the g1-th column of the plurality of pixel circuits is connected to the electric circuit of the r-th row and the v-th column of the plurality of electric circuits,
wherein the pixel circuit of the a-th row and the h1-th column of the plurality of pixel circuits is connected to the electric circuit of the s-th row and the v-th column of the plurality of electric circuits,
wherein the pixel circuit of the a-th row and the e2-th column of the plurality of pixel circuits is connected to the electric circuit of the s-th row and the w-th column of the plurality of electric circuits,
wherein the pixel circuit of the a-th row and the f2-th column of the plurality of pixel circuits is connected to the electric circuit of the r-th row and the w-th column of the plurality of electric circuits, and
wherein $T<J$ and $U<K$, f1 and g1 are integers between e1 and h1, q and r are integers between p and s, and $g1<h1<e2<f2$.

21. The semiconductor apparatus according to claim 20, wherein the pixel circuit of the b-th row and the e1-th column of the plurality of pixel circuits is connected to the electric circuit of the p-th row and the v-th column, wherein the pixel circuit of the b-th row and the f1-th column of the plurality of pixel circuits is connected to the electric circuit of the q-th row and the v-th column, wherein the pixel circuit of the b-th row and the g1-th column of the plurality of pixel circuits is connected to the electric circuit of the r-th row and the v-th column, and the pixel circuit of the b4-th row and the h1-th column of the plurality of pixel circuits are connected to the electric circuit of the s-th row and the v-th column.

22. The semiconductor apparatus according to claim 20,
wherein the pixel circuit of the a-th row and the h2-th column of the plurality of pixel circuits is connected to the electric circuit of the p-th row and the w-th column of the plurality of electric circuits,
wherein the pixel circuit of the a-th row and the e3-th column of the plurality of pixel circuits is connected to the electric circuit of the p-th row and the x-th column of the plurality of electric circuits,
wherein the pixel circuit of the a-th row and the f3-th column of the plurality of pixel circuits is connected to the electric circuit of the q-th row and the x-th column of the plurality of electric circuits, and
wherein f2<h2<e3<f3 and v<w<x.

23. The semiconductor apparatus according to claim 1,
wherein the pixel circuit of the c1-th row and the e1-th column of the plurality of pixel circuits is connected to the electric circuit of the p2-th row and the v-th column of the plurality of electric circuits,
wherein the pixel circuit of the c2-th row and the f1-th column of the plurality of pixel circuits is connected to the q2-th row and the v-th column of the plurality of electric circuits,
wherein the pixel circuit of the c3-th row and the g1-th column of the plurality of pixel circuits is connected to the electric circuit of the r2-th row and the v-th column of the plurality of electric circuits, and
wherein the pixel circuit of the c4-th row and the h1-th column of the plurality of pixel circuits is connected to the electric circuit of the s2-th row and the v-th column of the plurality of electric circuits.

24. The semiconductor apparatus according to claim 20, wherein e2=h1+1.

25. The semiconductor apparatus according to claim 20, wherein T=e2−e1.

* * * * *